United States Patent
Riess et al.

(10) Patent No.: US 6,433,355 B1
(45) Date of Patent: *Aug. 13, 2002

(54) NON-DEGENERATE WIDE BANDGAP SEMICONDUCTORS AS INJECTION LAYERS AND/OR CONTACT ELECTRODES FOR ORGANIC ELECTROLUMINESCENT DEVICES

(75) Inventors: Walter Riess; Samuel C. Strite, both of Adliswil (CH)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/155,591
(22) PCT Filed: May 6, 1996
(86) PCT No.: PCT/IB96/00557
§ 371 (c)(1),
(2), (4) Date: Feb. 8, 1999
(87) PCT Pub. No.: WO97/47050
PCT Pub. Date: Dec. 11, 1997

(51) Int. Cl.[7] .............................................. H01L 33/00
(52) U.S. Cl. ........................................ 257/40; 257/103
(58) Field of Search .............................. 257/40, 76–78, 257/88, 94, 96, 97, 103; 313/503, 504

(56) References Cited

U.S. PATENT DOCUMENTS

| 4,106,951 A | * | 8/1978 | Masi ............................ 136/89 |
| 5,126,214 A | | 6/1992 | Tokailin et al. |
| 5,126,802 A | * | 6/1992 | Yoshikawa et al. ............ 357/8 |
| 5,128,587 A | * | 7/1992 | Skotheim et al. ........... 313/504 |
| 5,200,668 A | * | 4/1993 | Ohashi et al. ............... 313/498 |
| 5,349,209 A | * | 9/1994 | Moyer et al. ................. 257/80 |
| 5,739,545 A | * | 4/1998 | Guha et al. ................... 257/40 |
| 5,783,292 A | * | 7/1998 | Tokito et al. ................ 428/212 |
| 5,858,561 A | * | 1/1999 | Epstein et al. .............. 428/690 |
| 5,981,092 A | * | 11/1999 | Arai et al. ................... 428/690 |

FOREIGN PATENT DOCUMENTS

| EP | 0 448 268 | * | 9/1991 |
| JP | 62076576 | | 4/1987 |
| JP | 1-312874 | | 12/1989 |
| JP | 2-139893 | | 5/1990 |
| JP | 3-152897 | | 6/1991 |
| JP | 3-210791 | | 9/1991 |
| JP | 3-262170 | | 11/1991 |
| JP | 4-125683 | | 4/1992 |

OTHER PUBLICATIONS

Yang, Microelectronic Devices, 1988, McGraw–Hill, pp. 24, 25.*
PCT International Search Report dated Feb. 14, 1997 for PCT/IB96/00557.
Journal of Lightwave Technology, vol. 12, No. 12, Dec. 1, 1994, pp. 2107–2112, XP000493718, Kim H.H et al.. "Silicon Compatible Organic Light Emitter Diode".
Japanese Office Action dated May 15, 2001 with partial English translation.

* cited by examiner

Primary Examiner—Eddie Lee
Assistant Examiner—Bradley William Baumeister
(74) Attorney, Agent, or Firm—Marian Underweiser, Esq.; McGinn & Gibb, PLLC

(57) ABSTRACT

An organic light emitting device is provided having a substrate (60), an anode contact electrode (64), a cathode contact electrode (61), and an organic region (62, 63) in which electroluminescence takes place if a voltage is applied between the anode (64) and cathode (61). At least one of the electrodes (61, 64) comprises a non-degenerate wide bandgap semiconductor.

34 Claims, 16 Drawing Sheets

NON-DEGENERATE WIDE BANDGAP SEMICONDUCTORS AS INJECTION LAYERS AND/OR CONTACT ELECTRODES FOR ORGANIC ELECTROLUMINESCENT DEVICES

TECHNICAL FIELD

The present invention pertains to organic electroluminescent devices, such as discrete light emitting devices, arrays, displays, and in particular to injection layers and contact electrodes suited for such devices. It furthermore relates to a method for making the same.

BACKGROUND OF THE INVENTION

Organic electroluminescence (EL) has been studied extensively because of its possible applications in discrete light emitting devices, arrays and displays. Organic materials investigated so far can potentially replace conventional inorganic materials in many applications and enable wholly new applications. The ease of fabrication and extremely high degrees of freedom in organic EL device synthesis promises even more efficient and durable materials in the near future which can capitalize on further improvements in device architecture.

Organic EL at low efficiency was observed many years ago in metal/organic/metal structures as, for example, reported in Pope et al., Journal Chem. Phys., Vol. 38, 1963, pp. 2024, and in "Recombination Radiation in Anthracene Crystals", Helfrich et al., Physical Review Letters, Vol. 14, No. 7, 1965, pp. 229–231. Recent developments have been spurred largely by two reports of high efficiency organic EL. These are C. W. Tang et al, "Organic electroluminescent diodes", Applied Physics Letters, Vol. 51, No. 12, 1987, pp. 913–915, and by a group from Cambridge University in Burroughs et al., Nature, Vol. 347, 1990, pp. 539. Tang et al. made two-layer organic light emitting devices using vacuum deposited molecular dye compounds, while Burroughs used spin coated poly(p-phenylenevinylene) (PPV), a polymer.

The advances described by Tang and in subsequent work by the Cambridge group, for example in "Efficient LEDs based on polymers with high electron affinities", N. Greenham et al., Nature, Vol. 365, 1993, pp. 628–630, were achieved mainly through improvements in the design of EL devices derived from the selection of appropriate organic multilayers and contact metals.

Organic EL light emitting devices (OLEDs) function much like inorganic LEDs, except that light is commonly extracted through a transparent electrode deposited on a transparent glass substrate. The simplest possible structure, schematically illustrated in FIG. 1A, consists of an organic emission layer 10 sandwiched between two electrodes 11 and 12 which inject electrons ($e^-$) and holes (h'), respectively. Such a structure has been described in the above mentioned paper of Burroughs et al., for example. The electrons and holes meet in the organic layer 10 and recombine producing light. It has been shown in many laboratories, see for example: "Conjugated polymer electroluminescence", D. D. C. Bradley, Synthetic Metals, Vol. 54, 1993, pp. 401–405, "The effect of a metal electrode on the electroluminescence of Poly(p-phenylvinylene)", J. Peng et al., Japanese Journal of Applied Physics, Vol. 35, No. 3 A, 1996, pp. 1317–1319, and "Carrier tunneling and device characteristics in polymer LEDs", I. D. Parker, Journal of Applied Physics, Vol. 75, No. 3, 1994, pp. 1656–1666, that improved performance can be achieved when the electrode materials are chosen to match the respective molecular orbitals of the organic material forming the organic layer 10. Such an improved structure is shown in FIG. 1B. By choosing the optimized electrode materials 13 and 14, the energy barriers to injection of carriers are reduced, as illustrated. Still, such simple structures perform poorly because little stops electrons from traversing the organic layer 10 and reaching the anode 14, or the hole from reaching the cathode 13. FIG. 2A illustrates a device with a large electron barrier 16 such that only few electrons are injected, leaving the holes no option but to recombine in the cathode 15.

A second problem, illustrated in FIG. 2B, is that the mobilities of electrons and holes in most known organic materials, especially conductive ones, differ strongly. FIG. 2B illustrates an example where holes injected from the anode 18 quickly traverse the organic layer 19, while the injected electrons move much slower, resulting in recombination near the cathode 17. If the electron mobility in the organic layer 19 were larger than the holes', recombination would occur near the anode 18. Recombination near a metal contact is strongly quenched by the contact which limits the efficiency of such flawed devices.

Tang, as shown in FIG. 3, separated electron and hole transport functions between separate organic layers, an electron transport layer 20 (ETL) and a hole transport layer (HTL) 21, mainly to overcome the problems described above. In "Electroluminescence of doped organic thin films", C. W. Tang et al., Journal of Applied Physics, Vol. 65, No. 9, 1989, pp. 3610–3616, it is described that higher carrier mobility was achieved in the two-layer design, which led to reduced device series resistance enabling equal light output at lower operating voltage. The contact metals 22, 23 could be chosen individually to match to the ETL 20 and HTL 21 molecular orbitals, respectively, while recombination occurred at the interface 24 between the organic layers 20 and 21, far from either electrode 22, 23. As electrodes, Tang used a MgAg alloy cathode and transparent Indium-Tin-Oxide (ITO) as the anode. Egusa et al. in "Carrier injection characteristics of organic electroluminescent devices", Japanese Journal of Applied Physics, Vol. 33, No. 5 A, 1994, pp. 2741–2745 have shown experimentally that the proper selection of the organic multilayer can lead to a blocking of both electrons and holes at an organic interface remote from either electrode. This effect is illustrated by the structure of FIG. 3 which blocks electrons from entering the HTL 21 and vice versa by a clever choice of HTL and ETL materials. This feature eliminates non-radiative recombination at the metal contacts as illustrated in FIG. 1A and also promotes a high density of electrons and holes in the same volume leading to enhanced radiative recombination.

The heterojunction molecular orbital energy alignment illustrated in FIG. 3 actually reflects a trend in preferred OLED materials which is beneficial to device design (and to the present invention as will be discussed later). The trend is that materials which tend to transport electrons with high mobility 20 do so, in part, because their LUMOs lie at lower energy. Similarly, good hole conductive properties go hand-in-hand with HOMOs lying at higher energy. These facts make it more probable that a heterojunction formed between an electron and hole transporting organic layer will block the injection of one or both carriers at the interface due to the energy discontinuities of the respective molecular orbitals. The blocking effect localizes the carriers far from the quenching electrodes where they can recombine most efficiently.

Two technical terms are commonly used which describe the positioning of the two relevant organic molecular orbitals: the highest occupied molecular orbital (HOMO) and the lowest unoccupied molecular orbital (LUMO) of organic materials, or in the case of semiconductors, the positioning of their respective counterparts, the valence bands (VB) and conduction bands (CB). These terms in our treatment all have units of lower energies than a free electron, which reflects the fact that they are bound, and energy is required to remove electrons from nearly all known materials. For convenience, we arbitrarily define a free electron to have zero energy, and therefore speak in terms of the above quantities having negative energy values with respect to the free electron (or vacuum) state. The first of these terms is the work function, which describes how much energy is required to 'pull' the most weakly bound electron out of the material, i.e. to make it a free electron. In a metal or degenerate semiconductor (i.e. a semiconductor characterized by an extremely high free carrier concentration), the work function is identical to another quantity called the Fermi energy level. Metals or degenerate semiconductors have partially filled bands which are responsible for their large number of free conduction carriers. The Fermi energy level is the energy to which the highest energy band is filled, because it is these highest energy electrons which are the easiest to liberate energetically.

In the following, whenever we refer to an energy level, be it the work function, HOMO or LUMO, conduction band or valence band, or Fermi energy, it is in the above context.

With multilayer device architectures now well understood and commonly used, the major performance limitation of OLEDs is the lack of ideal contact electrodes. The main figure of merit for electrode materials known in the art is the position in energy of the electrode Fermi level relative to the energy of the organic molecular orbital into which it must inject (see Bradley and Parker above for detailed discussion). In some applications it is also desirable for the electrode material to be either transparent or highly reflective. The electrode should also be chemically inert and capable of forming a dense uniform film to effectively encapsulate the OLED. It is also desirable that the electrode not strongly quench organic EL.

No cathode material has yet been identified which is transparent, conductive, chemically stable, and a good electron injector for OLEDs. Good electron transporting organic materials have their lowest unoccupied molecular orbitals (LUMO) matched in energy only with low work function metals. A low work function in a metal is tantamount to high chemical reactivity. While, e.g., Ca has its work function well matched in energy to an Alq3 (tris(8-hydroxyquinoline aluminum)) organic electron transport layer LUMO, a Ca cathode survives intact only a short time in air, leading to rapid device degradation. It is also likely that such highly reactive metals undergo a chemical reaction with the nearby organic materials which also could have negative effects on device performance. Such a mechanism has been proposed by Parker in the above cited reference to explain why Sm or Yb cathode OLEDs have poorer performance than Ca cathode OLEDs despite the lower work function of Sm and Yb compared to Ca. A low work function cathode metal approach requires careful handling of the device to avoid contamination of the cathode metal, and immediate, high quality encapsulation of the device if operation in a normal atmosphere is desired. Even well encapsulated low work function metal contacts are subject to degradation resulting from naturally evolved gases, impurities, solvents from the organic LED materials.

On the other hand, the choice of a stable metal having a higher work function, e.g. Al, dictates that the device can only be operated at high voltages. High voltage is necessary because electron injection from Al into, e.g., the Alq3 LUMO is field assisted. The high operating voltage reduces device efficiency due to increased ohmic losses. In addition, the higher electrical fields present at increased voltages also are likely to degrade the device materials more rapidly by driving interdiffusion or exciting parasitic chemical reactions or recombination processes. Al contacts, of lesser reactivity compared to Mg or Ca, have still been observed to degrade during OLED operation, see e.g. L. M. Do et al., "Observation of degradation processes of Al electrodes in organic EL devices by electroluminescence microscopy, atomic force microscopy, and Auger electron microscopy", Journal of Applied Physics, Vol. 76, No. 9, 1994, pp. 5118–5121.

Many approaches have been attempted in order to solve the problem of cathode electrode instability, degradation and high injection voltage. A common approach is the use of a low work function metal subsequently buried under a thicker metal coating. In this case, pinholes in the metal still provide ample pathways for oxygen and water to reach the reactive metal below, as is described in: Y. Sato et al., "Stability of organic electroluminescent diodes", Molecular Crystals and Liquid Crystals, Vol. 253, 1994, pp. 143–150 and J. Kido et al., "Bright organic electroluminescent devices with double-layer cathode", IEEE Transactions on Electron Devices, Vol. 40, No. 7, 1993, pp. 1342–1344. Furthermore, such contacts are degraded by evolved gases from the OLED constituent materials. The overall lifetime of OLEDs using this approach is limited and extensive encapsulation is required.

Much less attention has been paid to the optimization of the anode contact, since ITO or Au anodes generally outperform the cathode contact. However, if the anode electrode could be improved, it would have a similarly positive effect on device performance and reliability as improved cathodes.

Indium-tin-oxide has been the anode of choice for years. Its major advantage is that it is a transparent conductor which also has a large work function (roughly 4.9 eV), and is therefore well suited for the formation of a transparent anode on glass. However, ITO is known to have a barrier to hole injection into preferred organic HTL materials. Parker showed that, by replacing ITO with Au, which has a larger work function, in an identical OLED structure, the device efficiency is doubled due to the elimination of the ITO/organic hole injection barrier. ITO is also responsible for device degradation as a result of In diffusion emanating from the ITO into the OLED which can eventually cause short circuiting. In diffusion from ITO into PPV was clearly identified in G. Sauer et al., "Characterization of polymeric LEDs by SIMS depth profiling analysis," Fresenius J. Analyt. Chem., in press. ITO also acts as an reservoir of oxygen, which is detrimental to organic LED materials when it diffuses from the ITO into the organic layers. This problem has been elucidated in: J. C. Scott et al., "Degradation and failure of MEH-PPV light-emitting diodes", Journal of Applied Physics, Vol. 79, 1996, pp. 2745–2751. ITO is a polycrystalline material in the form commonly used for OLEDs. The abundance of grain boundaries provides ample pathways for contaminant diffusion through the ITO. Finally, ITO also is a reservoir of oxygen which is known to have a detrimental effect on common organic materials. Despite all of these known problems related to ITO anodes, they are still favored in the art because no other transparent electrode material of similar or better quality is yet known in the art. At least one transparent electrode is necessary for a practical OLED, since the light must be efficiently extracted to be useful.

European Patent application 448,268 concerns a semiconductor luminescent device with an organic layer being sandwiched between two electrodes. At least one of these electrodes consist of an n-type inorganic semiconductor. A junction between this electrode and the organic layer forms a blocking contact against electron injection.

The article "Silicon Compatible Organic Light Emitting Diode", H. Q. Kim et al., Journal of Light wave Technology, Vol. 12, No. 12, December 1994, pp. 2107–2112, concerns organic light emitting diodes using n-doped silicon as cathode, or p-doped silicon as anode.

While Au has a large (5.2 eV) work function, long-lived OLED devices cannot be made using Au cathodes because of the very high diffusivity of Au in organic materials. Like In and O diffusion out of ITO, only worse, Au from the contact diffuses through the OLED and eventually short circuits the device. In addition, Au is not a practical anode material for most architectures because it is not transparent. For the lack of a transparent cathode material, the anode must be the transparent contact for present day OLEDs.

Other semiconductors besides ITO have been tried as OLED electrodes. I. D. Parker and H. H. Kim, "Fabrication of polymer light-emitting diodes using doped silicon substrates", Applied Physics Letters, Vol. 64, No. 14, 1994, pp. 1774–1776, showed that, depending on the semiconductor doping, the Si/SiO2 is capable of either hole or electron injection into organic thin films. This work applied the Si semiconductor electrode towards majority carrier injection, i.e. n-type Si for electron injection and p-type for hole injection. Si electrodes had a large barrier to both electron and hole injection into OLED materials. This is due to the small bandgap of Si and the moderate positioning of the Si conduction and valence bands in energy. Si is also absorbing to much of the visible spectrum, and represented no improvement over conventional metals. Parker and Kim circumvented the poor Si band energy positioning by adding a SiO2 interlayer between the Si contact and OLED. While the voltage drop across the SiO2 insulator permitted the Si bands to line up with their organic molecular orbital counterpart, electrons were not directly injected, rather forced to tunnel through the SiO2 insulator. Such OLEDs had turn-on voltages of >10 V, too high for efficient device operation.

The lack of inert, stable, energetically matched, and transparent electrode materials for low voltage, efficient and stable OLED operation remains a major obstacle to OLED development.

Organic LEDs have great potential to outperform conventional inorganic LEDs in many applications. One important advantage of OLEDs and devices based thereon is the price since they can be deposited on large, inexpensive glass substrates, or a wide range of other inexpensive transparent, semitransparent or even opaque crystalline or non-crystalline substrates at low temperature, rather than on expensive crystalline substrates of limited area at comparatively higher growth temperatures (as is the case for inorganic LEDs). The substrates may even be flexible enabling pliant OLEDs and new types of displays. To date, the performance of OLEDs and devices based thereon is inferior to inorganic ones for several reasons:

1. High operating voltage: Organic devices require more voltage to inject and transport the charge to the active region (emission layer) which in turn lowers the power efficiency of such devices. High voltage results from the need for high electric fields to inject carriers over energy barriers at the electrode/organic interfaces, and from the low mobility of the carriers in the organic transport layers (ETL and HTL) which leads to a large ohmic voltage drop arid power dissipation.
2. Low brightness: Today's OLEDs can produce nearly as many photons per electron as common inorganic LEDs, i.e. their quantum efficiency is good. OLEDs lag inorganic LEDs in brightness mainly because comparatively little charge can be conducted through the resistive transport layers (HTL or ETL). This well known effect is referred to as Space Charge Limited Current. Simply put, due to the low mobility of carriers in organic materials, a traffic jam develops which restricts the flux of electrons and holes reaching the emission layer. Better emitter materials cannot offer greatly improved brightness until high conductance transport layers are also available.
3. Reliability: Organic LEDs degrade in air and during operation. Several problems are known to contribute.
   A) Efficient low field electron injection requires low work function cathode metals like Mg, Ca, Li etc. which are all highly reactive in oxygen and water. Ambient gases and impurities coming out of the organic materials degrade the contacts.
   B) Conventional AgMg and ITO contacts still have a significant barrier to carrier injection in preferred ETL and HTL materials, respectively. Therefore, a high electric field is needed to produce significant injection current. Stress from the high field and ohmic heating at the resistive electrode/organic interface contribute to device degradation.
   C) The high resistance of carrier transport layers heats the device under operation.
   D) Thermal stability of most OLED materials is poor making them sensitive to heating. Upon heating, many amorphous organic materials crystallize into grains. The crystallites have less volume and pack less uniformly than the amorphous solid. The resulting gaps and odd shapes of the crystallites make conduction from one crystallite to the next difficult, increasing resistance and heating in a positive feedback loop, while opening further channels for gaseous contaminants to penetrate, or for neighboring materials to diffuse. The relationship between crystallization in organic materials and the mobility is well understood from the photoconductor literature in for example: Borsenberger and Weiss, "Organic photoreceptors for imaging systems", Marcel Dekker Inc., New York, 1993.
4. Poor chemical stability: Organic materials commonly used in OLEDs are vulnerable to degradation caused by reaction with and diffusion of contact electrode materials and the ambient atmosphere.

OLEDs are mainly limited by their contacts and transport layers, and feedback from the transport layer heating. It is thus highly desirable to replace the low work function metal based cathodes with a stable, possibly transparent cathode characterized by barrierless charge injection into OLEDs. It is also highly desirable to replace ITO anodes with a stable, non-diffusive, and possibly transparent anode characterized by barrierless charge injection into OLEDs.

However, present day solutions inhibit performance and degrade device reliability. The price of distancing the active layer from the metal contacts for higher recombination efficiency are ohmic voltage drops across the HTL/ETL, leading to heating and power consumption. Low work function metals are unstable and unreliable. ITO introduces impurities and has a barrier to hole injection.

As can be seen from the above examples and the description of the state of the art the contact materials need to be improved to realize OLEDs and displays based thereon with superior characteristics. Little progress has been recorded in the search for improved electrode materials, because researchers have only searched within the known paradigm of what defines a good electrode material: a material having a favorable work function.

The work function of a material is defined as the separation in energy between the Fermi energy and the vacuum reference energy. In metals, one can inject electrons from just below the Fermi energy. or holes from just above the Fermi energy. There is no possibility of using other bands due to the density of electrons. Although ITO is theoretically a wide bandgap semiconductor, it corresponds to the classical metal-based model, as we discuss below.

ITO is a wide bandgap semiconductor which has been successfully used to inject holes into OLEDs. ITO is a highly degenerate n-type material characterized by electron concentrations on the order of $10^{21}$ cm$^{-3}$. The ITO conduction band is positioned at approximately the correct energy for injecting holes into an organic HOMO, i.e. ITO has a large work function. Because of the large electron concentration, the ITO Fermi energy, which defines the work function for a given ITO sample, lies several 100 meV above the conduction band. Above the Fermi level are empty states which act as holes, and it is these holes, not ones in the VB, which are injected into the organic material. Therefore, ITO electrodes inject via the exact mechanism that a Au electrode does, from just above the Fermi energy, and ITO does not fall under the inventive approach described below.

It is an object of the present invention to provide new and improved organic EL devices, arrays and displays based thereon.

It is a further object of the present invention to provide new and improved organic EL devices, arrays and displays based thereon with improved efficiency, lower operating voltage, and increased stability and reliability.

It is a further object to provide a method for making the present new and improved organic EL devices, arrays and displays.

SUMMARY OF THE INVENTION

The above objects have been accomplished by providing an OLED wherein at least one of the contact electrodes, either the cathode or anode, comprises a non-degenerate wide bandgap semiconductor (n-d WBS), i.e., a semiconductor having a bandgap greater than 2.5 eV. If the anode comprises a n-d WBS, this n-d WBS is to be chosen such that holes are injected from the valence band of the anode into the HOMO of the adjacent organic material. A n-d WBS cathode has to be chosen such that electrons are injected from the conduction band of the n-d WBS into the LUMO of the adjacent organic material.

The inventive approach depends on the fact that any semiconductor whose bandgap is comparable or greater than the bandgap of typical OLED materials, i.e. >2.5 eV, will 'a priori' have its conduction and/or valence band positioned at a favorable energy level with respect to the organic HOMO or LUMO, respectively, such that injection of one or both carrier types can occur at low voltage across little or no energy barrier. The inventive approach also benefits from the many improved properties of semiconductors, especially non-degenerate wide bandgap semiconductors, for OLED electrodes, including good conductivity, transparency in the visible spectrum, chemical inertness, hardness, and ability to be deposited in the amorphous or polycrystalline state at extremely low temperatures on glass, organic thin films, or other amorphous or crystalline substrates. Plastic may also serve as substrate.

In one embodiment of the present invention, a single or multi-layer OLED structure having a n-d WBS cathode directly in contact with the corresponding organic layers, and a conventional opposite contact electrode is envisioned.

In another embodiment of the present invention, a single or multi-layer OLED structure having a n-d WBS anode directly in contact with the corresponding organic layer, and a conventional opposite contact electrode is envisioned.

In another embodiment of the present invention, a single or multi-layer OLED structure having both a n-d WBS anode and a n-d WBS cathode directly in contact with the corresponding organic layer is envisioned.

In another embodiment of the present invention, an OLED structure having a n-d WBS electrode whose performance is improved by introducing a second and/or third semiconductor is envisioned. The second semiconductor is in direct contact with the corresponding organic layer, and is characterized by an improved matching of the injecting band to the corresponding organic layer molecular orbital. The second semiconductor might be an alloy of the n-d WBS, or it might be a wholly different semiconductor. The third semiconductor is farthest from the organic layers, and is characterized by the ability lo form an improved ohmic contact to a highly conducting lateral transport layer. The third semiconductor might also be an alloy of the n-d WBS, or it may be a wholly different semiconductor.

In yet another embodiment of the present invention, an OLED in which a n-d WBS injecting layer is in direct contact to the nearest organic layer, but has a thin embedded metal interlayer very near to the n-d WBS/organic interface. The metal can be selected for its work function, properties as a diffusion barrier between the organic materials and the n-d WBS, or transparency, and serves the purpose of further improving the stability or electron injection of the n-d WBS/organic interface. The n-d WBS on the opposite side of the thin embedded metal layer can be the same n-d WBS, or a different n-d WBS.

In yet another embodiment of the present invention, an OLED in which a n-d WBS electrode is separated from the nearest organic layer by a thin metal interlayer is envisioned. The metal can be selected for its transparency, work function, or properties as a barrier between the organic materials and n-d WBS, and serves the purpose of further improving the stability or electron injection of the n-d WBS/organic interface.

The introduction of a n-d WBS based-electrode leads to the following advantages:
1. Low voltage carrier injection is realized through the highly favorable alignment of the n-d WBS energies with respect to preferred OLED materials.
2. n-d WBS's are highly transparent to visible light.
3. n-d WBS's are chemically inert and thermally stable and therefore have no undesirable solid state interactions with the organic layers with which it is in contact or close proximity.
4. n-d WBS's are an outstanding encapsulant and mechanical protectant material for OLEDs, due to their nearly amorphous state and low impurity diffusion rates.
5. n-d WBS's can be deposited at conditions required for OLED formation (e.g. low temperature, amorphous substrates, minimum damage to the growth surface) in a conductive state.
6. n-d WBS's quench optical recombination in nearby organic layers less strongly than metals enabling reduced transport layer thicknesses.

DESCRIPTION OF THE DRAWINGS

The invention is described in detail below with reference to the following schematic drawings (it is to be noted that the drawings are not drawn to scale).

GENERAL DESCRIPTION

The basis of the present invention is the realization that a n-d WBS has either its conduction band (CB) or valence band (VB) or both positioned at a favorable energy level to inject charge into common OLED materials, In order to evaluate n-d WBS's as electrode materials, an ideal OLED electrode must first be defined.

An ideal contact electrode material should be characterized by:
1. High transparency in the visible spectrum and low quenching of nearby radiative recombination to permit flexibility in the direction of light extraction and the design thickness of organic layers.
2. One or more favorable energy band levels for low voltage injection of charge into preferred OLED materials.
3. Sufficient electrical conductivity such that total vertical device series resistance is unaffected by the electrode. The electrode material need not be extremely conductive since additional highly conductive layers can be added to enhance the lateral conductivity.
4. Depositability onto organic layers or amorphous, crystalline or polycrystalline substrates at low temperatures with no damage to the underlying material.
5. Chemical inertness
6. Low diffusivity of impurities
7. Mechanical hardness and thermal stability Item 1 is satisfied because n-d WBS's are by definition transparent to most or all of visible light. This is because few electronic states exist within the forbidden gap of 2.5 eV or more, meaning that negligible absorption occurs for photons having energies below the semiconductor bandgap.

Figure 1A:
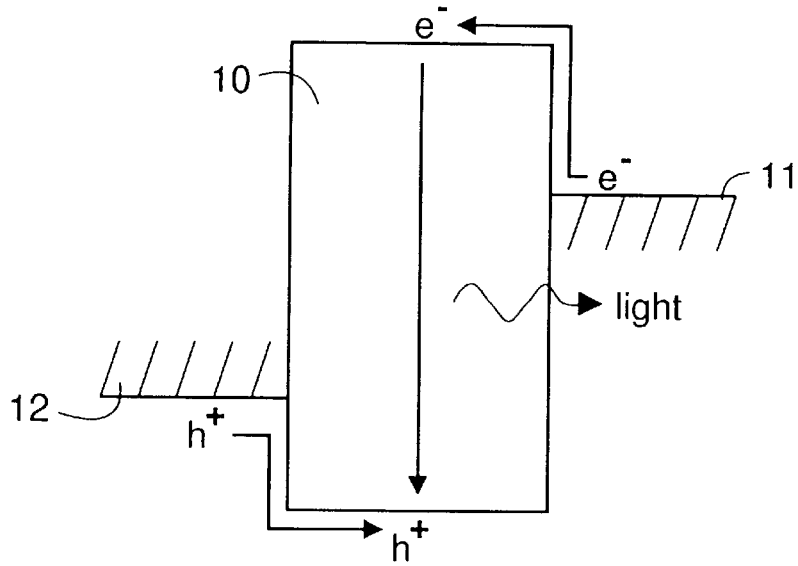
FIG. 1A shows a known OLED having an emission layer and two electrodes.
Figure 1B:
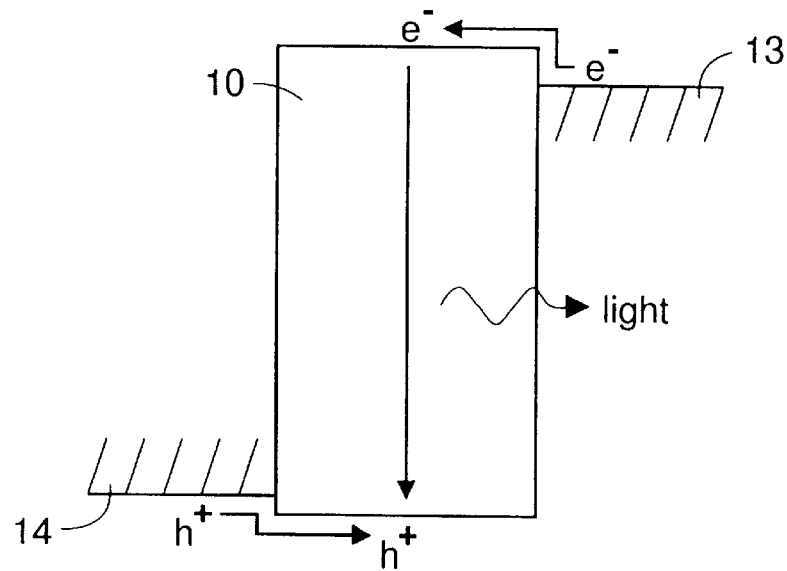
FIG. 1B shows another known OLED having an emission layer and two metal electrodes, with work functions chosen such that the energy barrier for carrier injection is reduced.
Figure 2A:
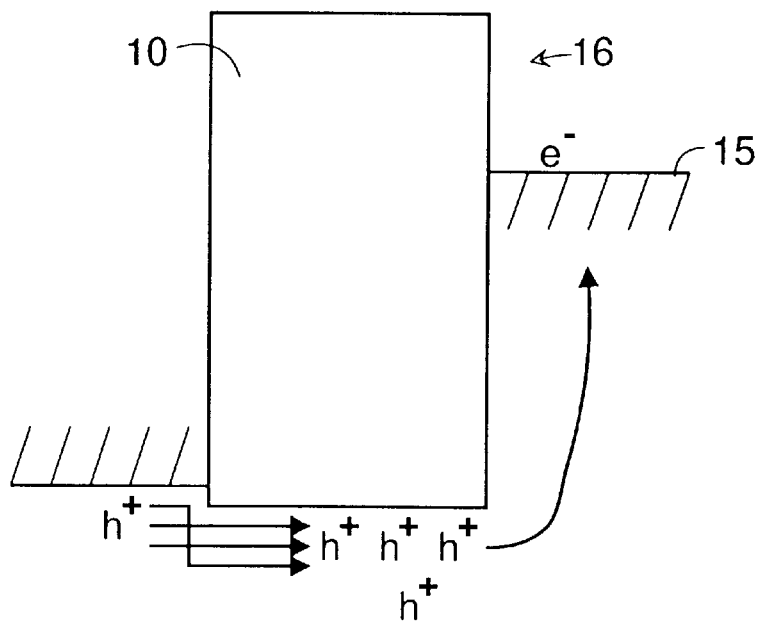
FIG. 2A shows another known OLED having an emission layer and two metal electrodes, the work function of the anode being chosen such that the energy barrier for hole injection is low, whereas the work function of the cathode poorly matches the emission layer yielding little electron injection and little radiative recombination in said emission layer.
Figure 2B:
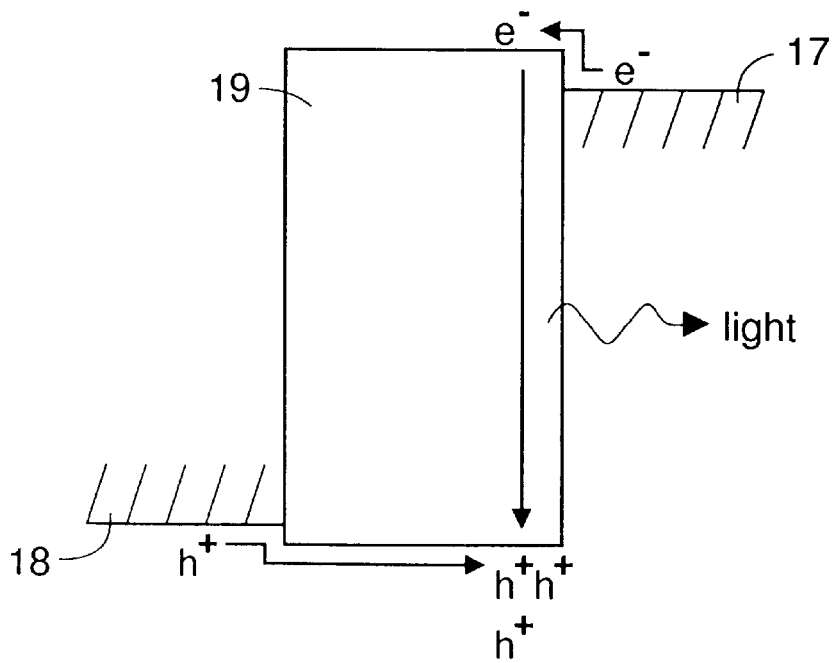
FIG. 2B shows another known OLED having an emission layer with low electron mobility compared to hole mobility such that the recombination occurs close to the cathode where it is quenched.
Figure 3:
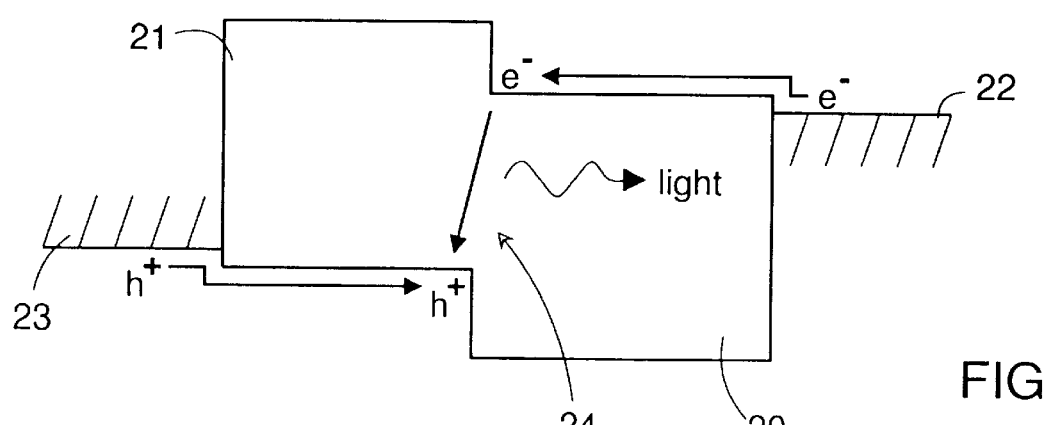
FIG. 3 shows another known OLED having an electron transport layer and hole transport layer.
Figure 4:
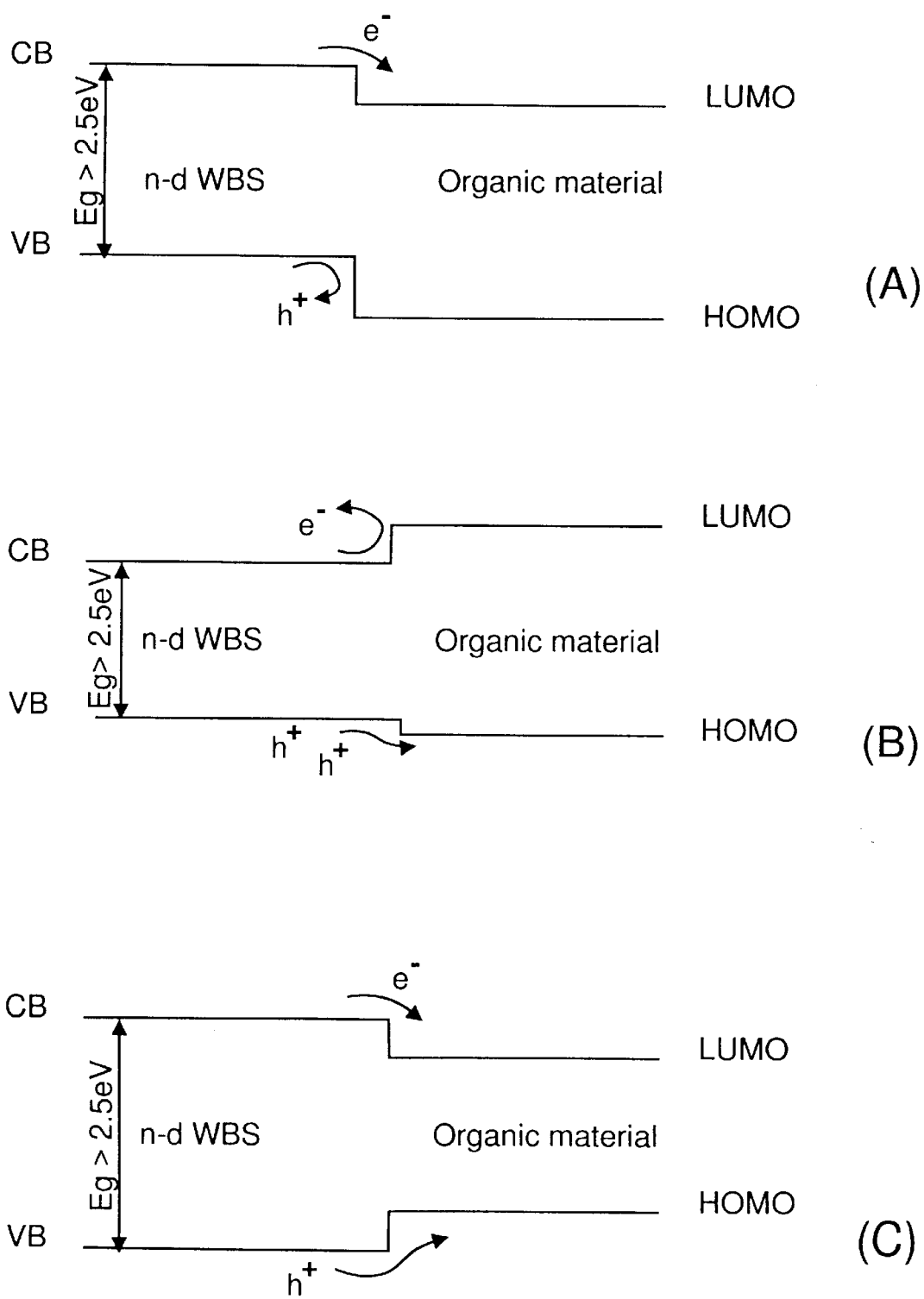
FIG. 4 shows the three possible types of band lineups between the conduction bands (CB) and valence bands (VB) of a n-d WBS and the lowest unoccupied molecular orbital (LUMO) and highest occupied molecular orbital (HOMO) of an organic material which is in contact with the n-d WBS. (A) CB is above the LUMO, VB is above the HOMO: This interface can inject electrons into the organic. (B) n-d WBS has a bandgap slightly smaller than the organic. CB is below the LUMO, VB is slightly above the HOMO: This interface can efficiently inject holes into the organic over the small barrier. (C) CB is above the LUMO, VB is below the HOMO: The ideal case; injection of either polarity, dependent on the bias direction, can occur at low voltage.

Item 2 is satisfied because the bandgap of a n-d WBS is comparable or larger than that of common OLED materials. This means that either the CB, VB, or in some cases both bands (see FIG. 4(C)), are situated at favorable energy levels with respect to a LUMO or HOMO of a particular OLED material. In short, if a n-d WBS, does not efficiently inject holes into an OLED material, it must inject electrons efficiently, or vice versa. Furthermore, due to the tendency of electron transporting organic materials to have LUMOs lower in energy than hole transporting materials, and hole transporting materials to have HOMOs higher in energy than electron transporting organic materials, nature cooperates to make n-d WBS good injectors of both polarities for preferred OLED device embodiments. Some typical n-d WBS band alignments with respect to organic molecular orbital energies are illustrated in FIGS. 4(A)–(C) with the point of illustrating that in all cases, at least one n-d WBS band is positioned for charge injection across a small or non-existent energy barrier into its molecular orbital counterpart in the organic material.

Item 3 is satisfied because semiconductors can be doped, or conduct as a result of native defects or intrinsic carriers, and have much higher mobilities than common OLED materials. Even most intrinsic n-d WBS's are more conductive than common OLED materials, and will not be the limiting resistive voltage drop in the vertical device structure.

Item 4 is satisfied because most known n-d WBS's are also semiconducting in their amorphous or polycrystalline states, obtained when deposited at low temperature. Common semiconductor growth techniques are capable of depositing material at temperatures low enough to be compatible with common OLED substrates, and even below the glass transition temperatures of common OLED materials. Techniques which are compatible with OLED technology are chemical vapor deposition, plasma enhanced chemical vapor deposition, laser ablation, evaporation, molecular beam deposition (MBD), and plasma enhanced MBD.

Items 5–7 are also satisfied for n-d WBS's, which generally have relatively ionic or strong covalent bonds. Such bonds are much stronger than those of organic materials which are weakly bound by intermolecular van der Waals bonding.

To summarize the state of the art in contrast to the inventive approach, highly conducting materials, be they metals or degenerate semiconductors such as ITO, inject their carriers from their Fermi energy level. They are effectively one band systems, and are limited by their work functions. It is notable that ITO's VB is extremely favorably positioned to act as a hole injector, being some 3–4 eV below most organic HOMO's in energy. This is due to the fact that ITO is indeed a wide bandgap semiconductor, and as we argue therefore has at least one band capable of low voltage injection. However, the ITO VB is useless for hole injection because of the degenerate n-type nature of ITO, which dictates that no free holes exist in the VB, and that holes injected in the ITO VB have a negligible mean free path before recombining with the plethora of electrons present. Again, this is precisely the physics of metals, which also have many bands, but only one band in which conduction can occur.

In contrast, the inventive approach is based on the fact that in a 'n-d WBS', either the VB is favorably positioned for hole injection, or the CB is favorably positioned for electron injection, or both. By 'n-d WBS', we mean a WBS whose carrier concentration is moderate enough such that it behaves like a semiconductor, as opposed to a metal, in the sense that it has a moderate enough carrier concentration to enable either band to be used for injection into the organic. In the minority carrier transport case (i.e. holes through an n-type semiconductor or electrons through a p-type semiconductor), the semiconductor must be largely depleted of majority carriers to support minority carrier transport over a useful and practical distance without recombination. A practical upper free carrier concentration limit is roughly $10^{20}$ cm$^{-3}$, which corresponds to a depletion width of 1–3 nm (depending on the semiconductor dielectric constant). If the carrier concentration is so large that no more than 1–3 nm of material can be depleted for the purposes of minority carrier transport, then the material does not meet the criteria to be an 'a priori' good electrode material of at least one polarity, since the minority carrier polarity can never be injected by a film of useful and practical thickness. Such a highly doped semiconductor may still be a good majority carrier electrode if its majority carrier band is positioned favorably in energy compared to common organic organic molecular orbitals, but this case falls under the old paradigm, i.e. a degenerate semiconductor is only capable of injecting charge from its Fermi level, and does not fall under the present invention. Further details on semiconductors can be taken from "Physics of Semiconductor Devices," S. Sze, Pub: John Wiley and Sons, New York, 1981.

Many WBS are similar to ITO in so far as it is difficult or impossible to control their Carrier concentrations. However, so long as the carrier concentrations Involved are moderate, <$10^{20}$ cm$^{-3}$, then the concept presented above is valid. The reason Is that a useful and practical thickness of the respective semiconductor can be depleted by an additional metal or semiconductor on the opposite side of the organic layer stack. This depletion permits erstwhile minority carriers to be transported through the non-majority carrier band, e.g. valence band in an equilibrium n-type semiconductor, to capitalize on a favorable energy level for injection in that band. Without the depletion, minority carriers would recombine with majority carriers before they could be Injected into the organic. Such recombination events directly degrade overall device operating efficiency. Simply put, a n-d WBS Is one In which a useful thickness can be depleted by an adjacent metal to permit both semiconductor bands to be utilized, in principle, for carrier injection into their organic molecular orbital counterparts.

Another advantage of semiconductors is that their bandgaps and band energies normally vary continuously when alloyed with an isoelectronic element or another semiconductor, in which a single component is replaced by an isoelectronic element. For example, the bandgap of Si can be continuously varied by the addition of Ge, or GaAs can be varied by the addition of either lnAs or AlAs. Similarly, the bandgaps and band energies can also be varied by alloying with a different semiconductor, e.g. AlN and SiC. The ability to grade an alloy concentration across a semiconducting electrode has several useful properties, including the ability to tune the band energies by varying the alloy concentration, the ability to eliminate barriers to carrier transport, and the ability to use a smaller bandgap material as an ohmic contact to the electrode.

Figure 5:
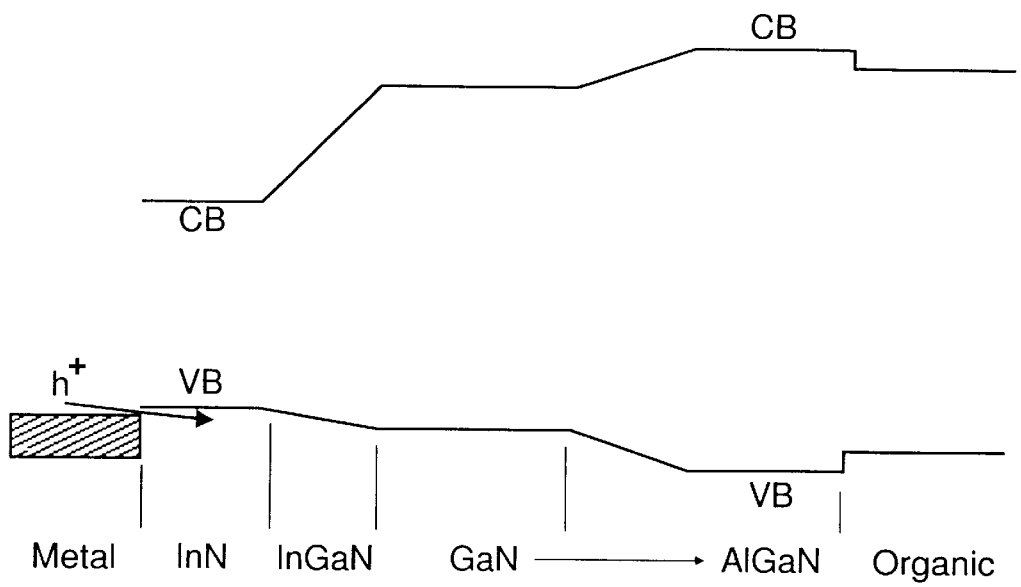
FIG. 5 shows a minority carrier organic contact electrode scheme relying on alloying for band matching.

In general, two types of contacts to organic material can be formed by a non-degenerate semiconductor electrode. This is in contrast to the case of degenerate semiconductors and metals in which injection of electrons or holes is only possible from the Fermi energy level. These two contact schemes are referred to by us as minority and majority carrier contacts, respectively. The formation of a minority carrier contact, incorporating graded alloys to improve ohmic contacts and injection, is illustrated in FIG. 5 for a non-degenerate wide bandgap semiconductor which has a n-type conductivity, but is used as an anode electrode for hole injection, i.e. for minority carrier injection. What is discussed below also applies to the case of a p-type semiconductor which is used to inject electrons. Near the organic film, the semiconductor is alloyed (by introduction of AlN to GaN, for example) to increase the bandgap and lower the VB energy so that there is no barrier to injection into the organic material HOMO. On the other side, the semiconductor is alloyed (e.g. by adding InN to GaN) to decrease the bandgap so that the VB energy is raised to match that of a hole Injecting metal or ITO. On both sides, the alloy content is graded so that the shift in the VB (or CB in the electron injection case) is smooth. Overall, the holes see no abrupt barriers, although voltage is necessary to drive them into the organic. Because holes are a minority carrier in this system, the entire semiconducting region must be thin enough that it is largely depleted of electrons by the metal or ITO hole injecting layer. This can be accomplished In a semiconducting film of practical and useful thickness (>1 nm) only in a non-degenerate semiconductor with <$10^{20}$ cm$^{-3}$ carrier concentration, as discussed above.

Figure 6:
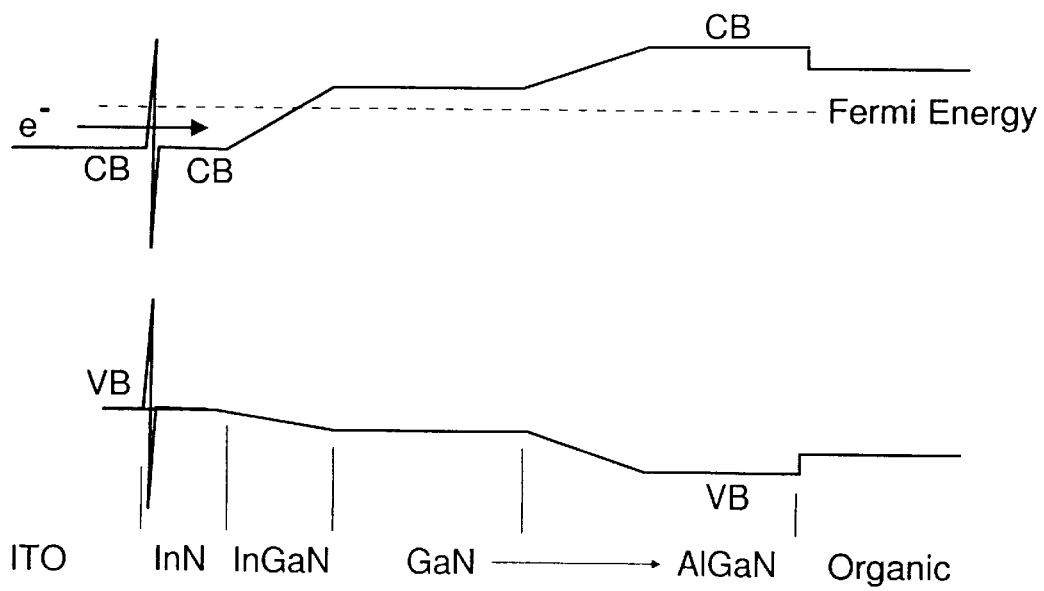
FIG. 6 shows a majority carrier organic contact electrode scheme relying on alloying for band matching to the organic and an ohmic contact to the lateral transport layer material.

The formation of a majority carrier contact, incorporating graded alloys to Improve ohmic contacts and injection, is illustrated in FIG. 6 for a n-d WBS, also n-type for the purpose of this example, which is used to inject electrons Into the organic LUMO. As in FIG. 5, the polarity could be changed to p-type, and the arguments would be the same. The wider bandgap alloy and grading retain their functions of matching the electrode to the LUMO and avoiding barriers in the alloy transition regions. The smaller bandgap alloy can, as in the case of FIG. 5 allow the material to better match the work function of an electron injecting metal, e.g. Al. Or, as shown in FIG. 6, the small bandgap alloy, if it has a high carrier density, can be used to form an ohmic contact to a material not matched in energy to its CB, but is otherwise desirable, such as ITO (useful for its combination of transparency and conductivity). The carrier concentration of semiconductors at the temperatures of interest to the present invention generally Increases as the bandgap decreases for several reasons, including an increase of Intrinsic carriers, and shallower dopant and defect levels. Therefore, it is advantageous to alloy down to a smaller bandgap to exploit ohmic tunneling contacts. For example, we have successfully injected electrons from ITO into an OLED through a GaN cathode graded down to an InN ohmic contact layer. This was despite the large differences in the InN and ITO work functions, and was successful because the depletion widths of each heavily doped material were thin enough to be tunneled through, consistent with well known principles of semiconductor physics for the formation of ohmic contacts. We further note for clarity that InN in the above example is not a n-d WBS. In general, semiconductors having bandgaps less than 2.5 eV are often useful as ohmic contact layers in the inventive n-d WBS based contact scheme. This is because a thin contact layer suffices for the purpose of ohmic contact formation, which given the low absorption coefficient of even smaller bandgap semiconductors In comparison to metals, means that the addition of a thin and useful ohmic contact layer does not markedly increase absorption losses in the device. Therefore, n-d WBS based contacts incorporating smaller bandgap semiconductor ohmic contact layers can still yield a highly transparent overall contact electrode.

GaN illustrates the above arguments and the present invention nicely, but they apply equally well to non-degenerate wide bandgap semiconductors in general, provided they meet the criteria detailed above. Examples of other non-degenerate wide bandgap semiconductors which could be useful electrode materials are non-degenerate wide bandgap III-N compounds such as GaN, AlN, BN, AlGaN, InGaN, InAlGaN, or II-VI compounds such as ZnS, MgS, ZnSe, MgSe, ZnMgSSe, CdS, ZnO, BeO, or more exotic non-degenerate wide bandgap semiconductors such as diamond, SiC or ZnGaSSe, $CaF_2$, AlP, just to mention some. It also applies to non-degenerate wide bandgap compounds which are doped to modify their electrical conductivity.

Figure 7:
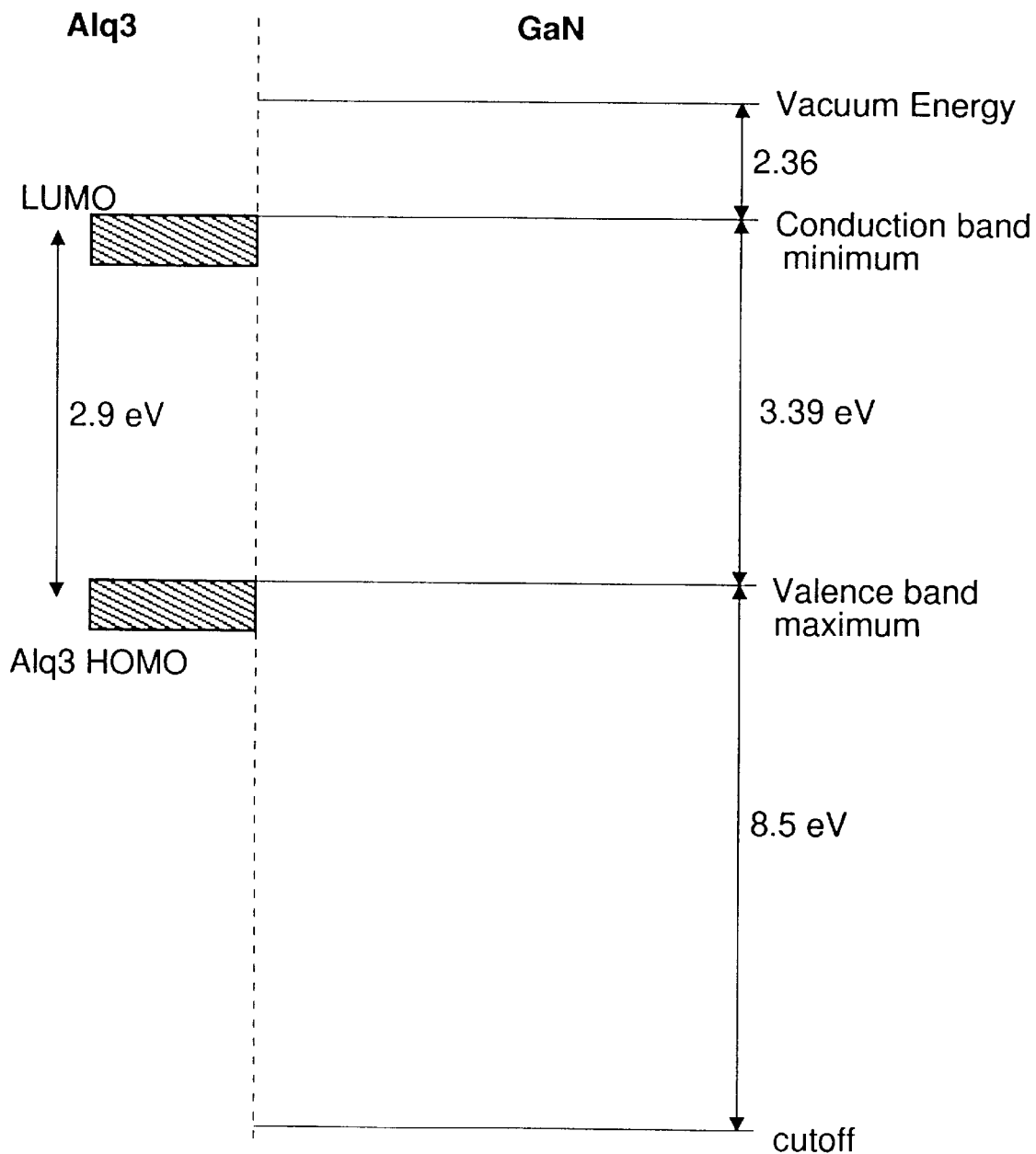
FIG. 7 shows the band structure measured by ultraviolet photoemission spectroscopy for a GaN/Alq3 heterojunction. Experimental error is included in the Alq3 bands as drawn. The data show that GaN/Alq3 corresponds to the bipolar injection case of FIG. 4(C). Experiments have confirmed that both GaN anodes and cathodes inject charge at low voltage.

FIG. 7 shows results of an ultraviolet photoemission spectroscopic (UPS) investigation of a GaN/organic (Alq3) heterojunction. With UPS, one observes the position of the GaN valence band with respect to the Alq HOMO. Taking into account the known energy separation between the GaN VB and CB (i.e. the GaN bandgap energy of 3.39 eV) and the Alq3 HOMO and LUMO, the full band structure, as displayed in FIG. 7, is elucidated. The data show that both the CB and the VB of GaN are favorably positioned for charge Injection into the Alq3. This also indicates that the GaN VB is positioned favorably in energy to barrierless hole injection into preferred OLED HTL materials, which as we discussed above, tend to have their HOMO energies higher than that of the electron transporting Alq3 HOMO level.

Figure 8:
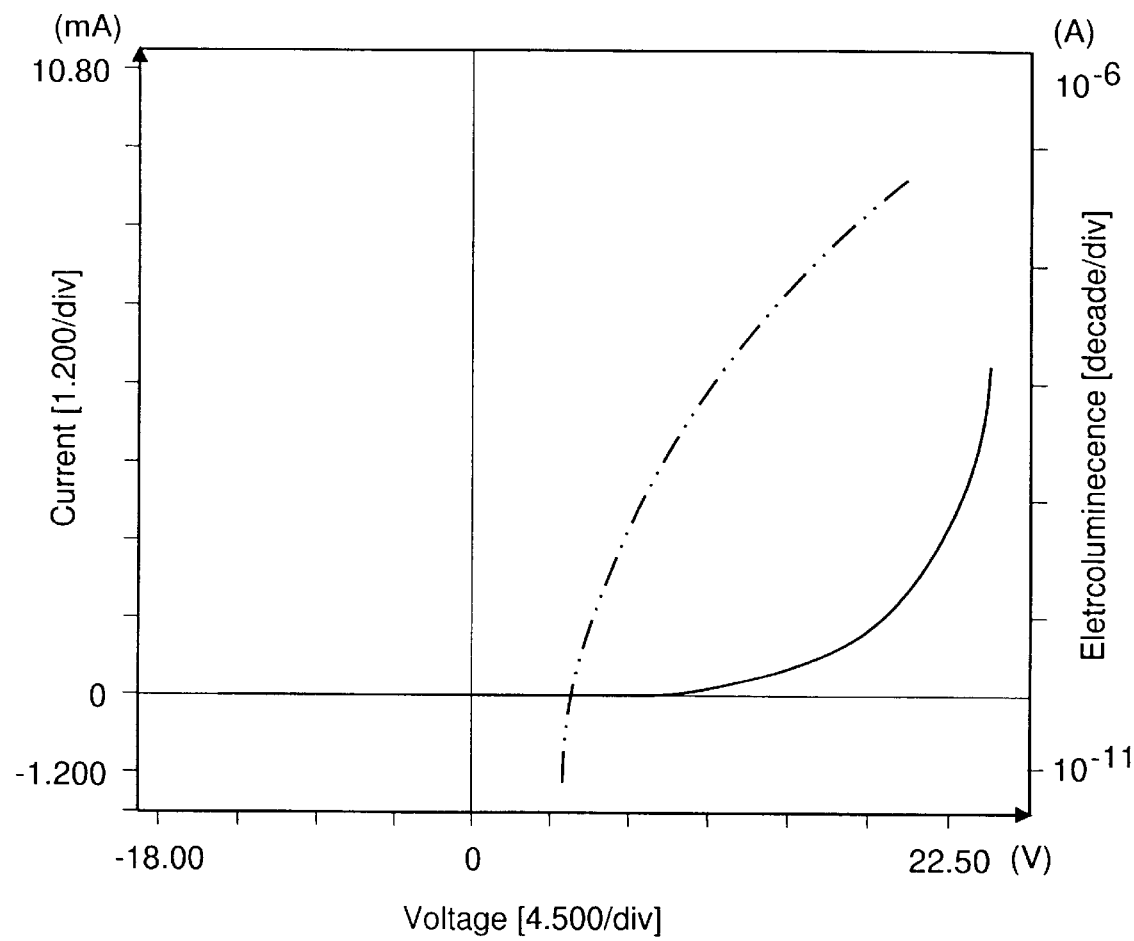
FIG. 8 shows the I-V and EL-V characteristics for a GaN-based cathode-up OLED structure fabricated in our laboratory. The excellent diode characteristics and the 4.8 V onset of EL are proof of the outstanding qualities of GaN cathodes, even when deposited on top of organic materials.

Further confirmation of the favorable positioning of the GaN bands comes directly from OLED devices fabricated In our laboratory. FIG. 8 are the (left axis, linear scale) current-voltage and (right axis, log scale) electroluminescence-voltage characteristics for an OLED having the following structure: Glass/ITO/CuPc/NPB/Alq3 /GaN-based cathode. The device shows excellent diode characteristics with low reverse bias current levels, and an onset of efficient electroluminescence at only 4.8 V indicating that the GaN cathode can inject electrons into Alq3 at low voltage, i.e. there is little or no barrier to electron injection. It is also notable that in the device of FIG. 8, the GaN was deposited directly onto the OLED stack by plasma enhanced molecular beam deposition, thereby directly demonstrating that a n-d WBS can successfully be deposited onto OLED materials, thereby satisfying item 4 on the above list of properties of an ideal electrode.

Numerous GaN cathode and anode devices fabricated in our laboratory with the n-d WBS deposited on the top of or below the organic layers confirm the data of FIG. 8 that GaN, because it is a n-d WBS with both favorable CB and VB energy levels for carrier Injection into OLEDs, is both an excellent anode and cathode for common OLED device structures, consistent with the Inventive approach outlined above.

Figure 9:
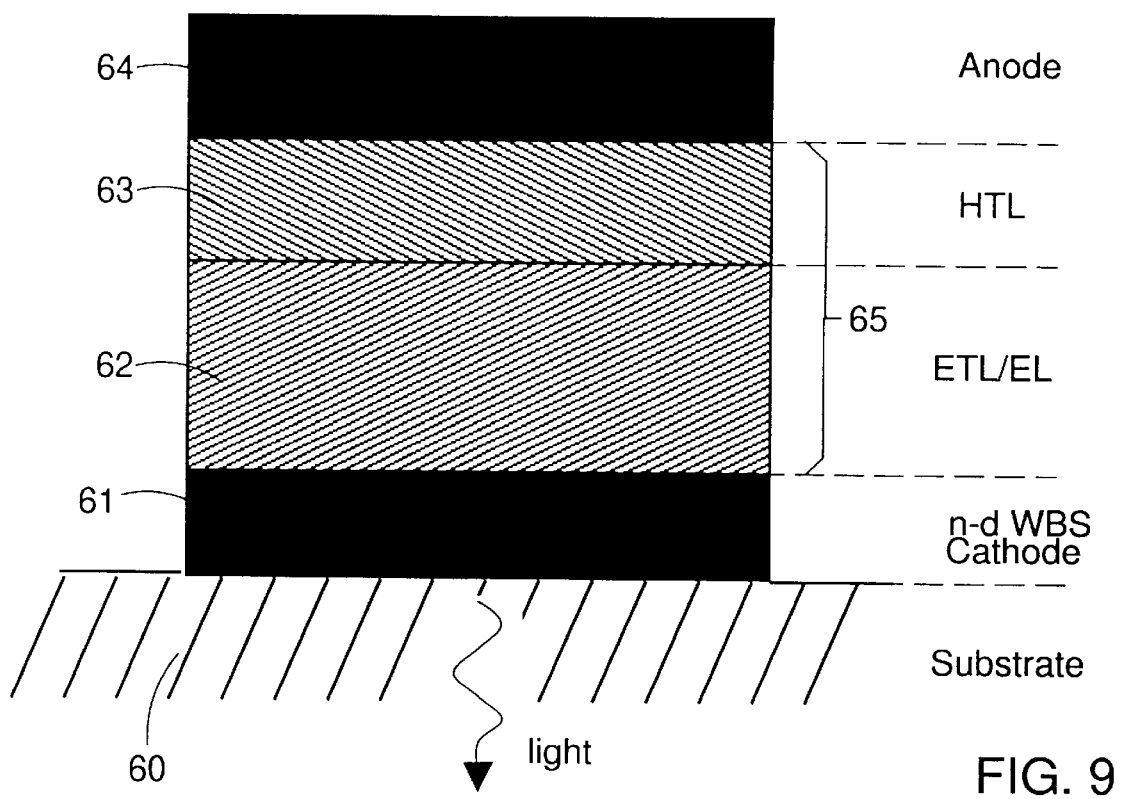
FIG. 9 shows a cross-section of the first embodiment of the present invention.

The simplest embodiment of the present invention, already improved with respect to the state of the art is depicted in FIG. 9, from the substrate up, listed in the order of deposition, is a glass/n-d WBS/ETL/HTL/Metal OLED structure. In addition to the eliminated or reduced barrier afforded by the cathode 61 comprising a n-d WBS formed on the glass substrate 60, the ETL 62 thickness may be reduced as a result of reduced optical quenching and the conventional ITO anode can be replaced by a higher work function, less diffusive metal since the anode 64 is no longer the transparent contact. We note here that the structure depicted in FIG. 9 might also benefit from an additional layer or layers (e.g. InGaN or ITO/InGaN) between the GaN cathode and glass 60 to lower the lateral sheet resistance of the cathode 61, provided that the additional layer, serving as lateral transport layer, also forms a good ohmic contact to the n-d WBS cathode. This additional layer is deemed to form part of the cathode. Finally, any substrate, even an opaque one, can replace the glass substrate 60 depicted. In this case, the preferred embodiment would have a transparent top contact 64, e.g. ITO in the case of a cathode 61 comprising a n-d WBS. The organic region 65 of the first embodiment comprises an ETL 62 and HTL 63. It is to be noted that the present Figure and all other Figures are not drawn to scale.

TABLE 1

Exemplary details of the first embodiment

| Layer | No. | Material | Thickness | present example |
|---|---|---|---|---|
| substrate | 60 | glass | 0.1 mm–5 mm | 1 mm |
| cathode | 61 | GaN | 10–1000 nm | 50 nm |
| ETL and EL | 62 | Alq3 | 20–1000 nm | 80 nm |
| HTL | 63 | TAD | 5–500 nm | 50 nm |
| anode | 64 | Au | 10–2000 nm | 50 nm |

Figure 10:
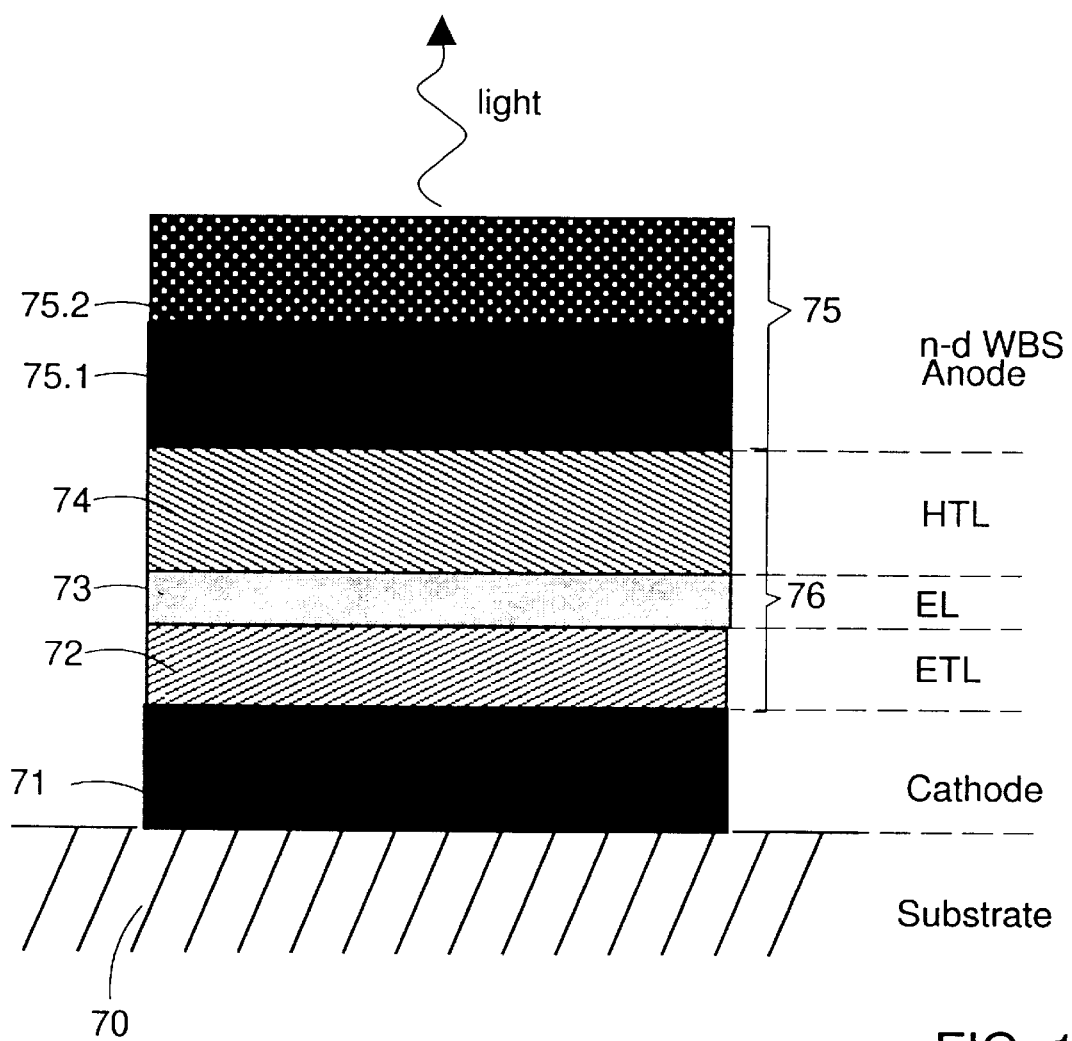
FIG. 10 shows a cross-section of the second embodiment of the present invention.

A second embodiment, a n-d WBS anode device, is depicted in FIG. 10. From the substrate 70 up, listed in the order of deposition, is a glass metal/ETL/EL/HTL/n-d WBS anode OLED structure. The major difference between FIG. 9 and FIG. 10 Is that the anode 75 comprising a n-d WBS is deposited last on top of the organic layer stack 76, which in this case includes a separate emission layer 73 (EL), as is sometimes practiced In the art. Also, the anode 75 might comprise an additional layer or layers, such as an ohmic contact contact or lateral transport layer 75.2, for example, as illustrated in FIG. 10. In the case of an ohmic contact layer 75.2, an additional metal or ITO top layer (not shown) would be advantageous for lateral conduction. Any substrate other than glass can be chosen, even an opaque one. In the latter case, the anode 75 is preferably designed to be fully transparent for ease of light extraction. The organic region 76 of the second embodiment comprises an ETL 74, a layer 73 suited for electroluminescence (EL) and HTL 72.

TABLE 2

Exemplary details of the second embodiment

| Layer | No. | Material | Thickness | present example |
|---|---|---|---|---|
| substrate | 70 | glass | 0.1 mm–5 mm | 1 mm |
| cathode | 71 | MgAg | 10–300 nm | 50 nm |
| ETL | 72 | Alq3 | 5–500 nm | 20 nm |
| EL | 73 | coumarine-doped Alq3 | 20–1000 nm | 70 nm |
| HTL | 74 | TAD | 5–500 nm | 50 nm |
| anode contact | 75.1 | GaN | 10–2000 nm | 50 nm |
| ohmic contact layer | 75.2 | InGaN | 10–2000 nm | 50 nm |
| outer anode (not shown) | 75.3 | ITO | 10–2000 nm | 50 nm |

We would like to note that the devices depicted in FIGS. 9 and 10 would function equally well in n-d WBS anode down or n-d WBS cathode up architectures, respectively, provided that the polarity of the organic layers and the choice of opposite electrode materials are suitably altered. E.g., the device depicted in FIG. 9 could be modified to have a Glass/n-d WBS/HTL/ETL/MgAg structure, and the device depicted in FIG. 10 could be modified to have a Glass/ITO/HTL/EL/ETL/n-d WBS structure.

Figure 11:
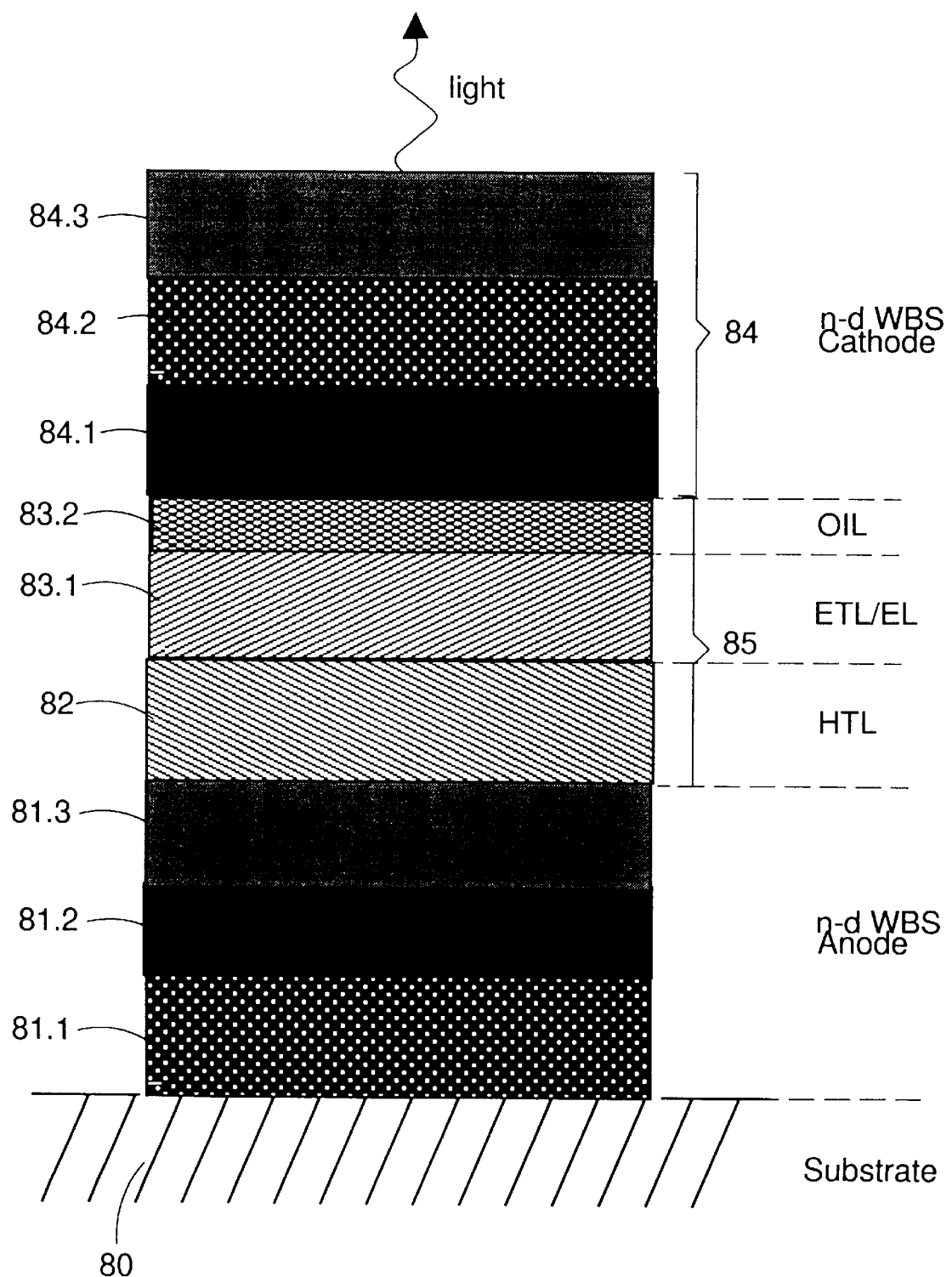
FIG. 11 shows a cross-section of the third embodiment of the present invention.

A third embodiment of the present invention is depicted in FIG. 11. From the substrate 80 up, listed in the order of deposition, this embodiment comprises glass/n-d WBS anode/HTL/(ETL, EL)/OIL/n-d WBS cathode. This structure functions much like the devices of FIGS. 9 and 10, except the device is further improved by having both contacts comprising n-d WBS's. The organic region 85 of the third embodiment comprises a combined ETL/EL layer 83 and a HTL 82, as is often practiced in the art. We have also added an organic injection layer (OIL) 83.2. The OIL might have the properties that it is less sensitive to damage caused by the deposition of the n-d WBS cathode, or that it has a LUMO energy intermediate between that of the n-d WBS 84.1 CB and the ETL 83.1 LUMO, further reducing the magnitude of any barrier which might be present to election injection.

TABLE 3

Exemplary details of the third embodiment

| Layer | No. | Material | Thickness | present example |
|---|---|---|---|---|
| substrate | 80 | silicon | 0.1 mm–5 mm | 2 mm |
| sub-anode | 81.1 | ITO | 10–300 nm | 50 nm |
| ohmic contact | 81.2 | MgCdSTe | 10–300 nm | 50 nm |
| anode | 81.3 | MgS | 10–300 nm | 50 nm |
| HTL | 82 | TAD | 5–500 nm | 50 nm |
| ETL and EL | 83.1 | Oxadiazole | 50–1000 nm | 70 nm |
| OIL | 83.2 | organic | 2 nm–200 nm | 15 nm |
| cathode | 84.1 | AlGaN | 10–2000 nm | 50 nm |
| ohmic contact layer | 84.2 | InGaN | 10–2000 nm | 50 nm |
| outer cathode | 84.3 | ITO | 10–2000 nm | 50 nm |

Figure 12:
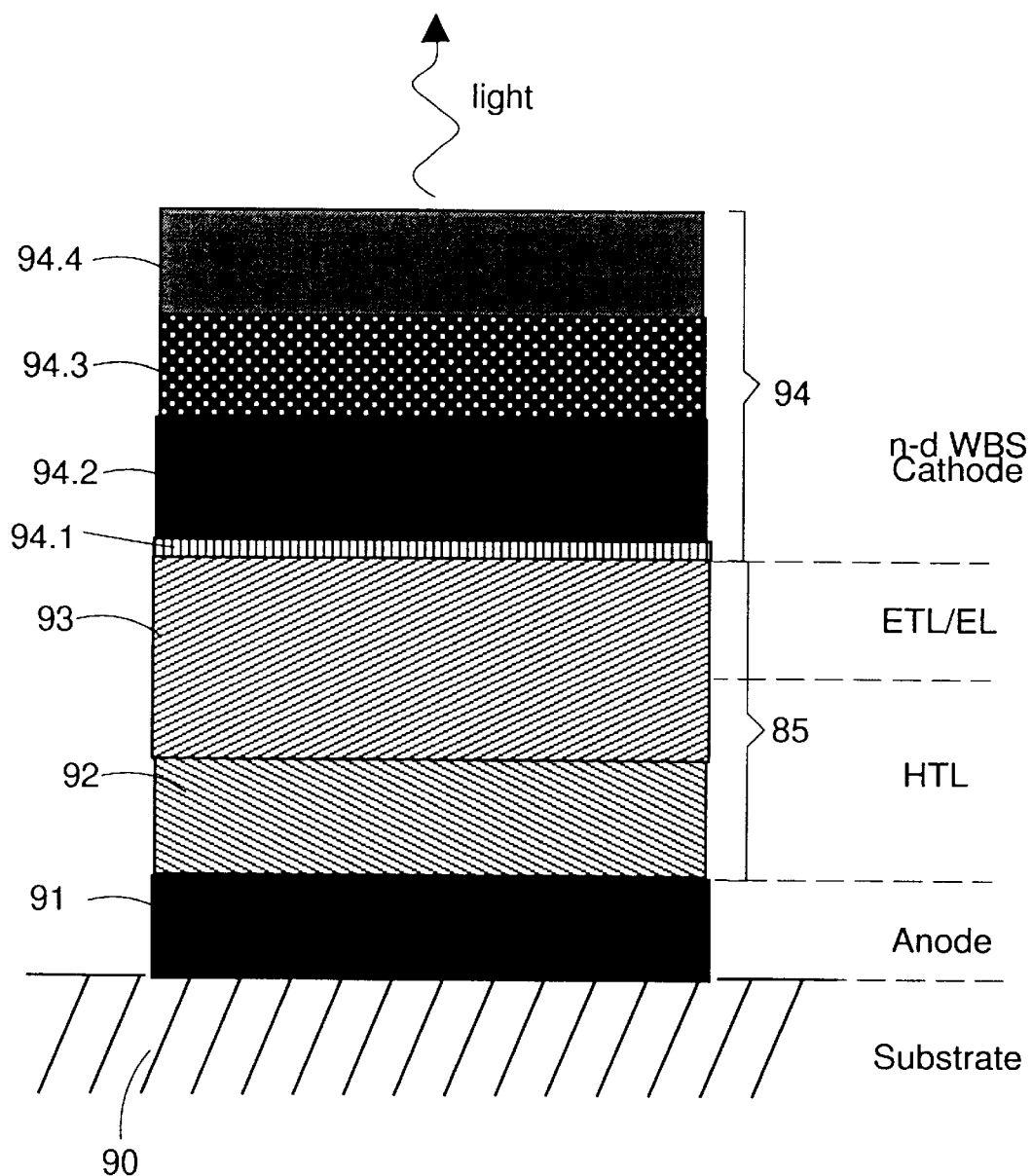
FIG. 12 shows a cross-section of the fourth embodiment of the present invention.

A fourth embodiment of the present invention is depicted in FIG. 12. From the substrate 90 up, listed in the order of deposition, is a glass/metal/HTL/(ETL, EL)/metal/n-d WBS OLED structure. This structure capitalizes on a more conductive alloy 94.3 of the primary n-d WBS 94.2 on the outer cathode side to facilitate an ohmic contact to the outer cathode as discussed in relation to FIG. 6. In addition, the thin metal 94.1 interlayer has the additional advantages of improving injection via a low metal 94.1 work function, or improving reliability and stability by protecting the organic layer stack 85 from the n-d WBS cathode 94 deposition and/or cross diffusion and/or chemical reactions. The concept of advantageously alloying the n-d WBS electrode illustrated in FIG. 12 is equally valid for related embodiments incorporating e.g. a n-d WBS based anode, or a minority carrier n-d WBS contact of either polarity as discussed in relation to FIG. 5. The concept of the thin metal 94.1 interlayer is equally valid for anode formation, provided the metal be chosen for its high work function if its chief role is to enhance hole Injection. If the role of the thin metal 94.1 interlayer in the anode is primarily to form a barrier, then a low work function metal could also be used for anode formation, provided that the metal is thin, or largely consumed by chemical reactions with the adjacent organic layer or the n-d WBS based contact.

TABLE 4

Exemplary details of the fourth embodiment

| Layer | No. | Material | Thickness | present example |
|---|---|---|---|---|
| substrate | 90 | silicon | 0.1 mm–5 mm | 5 mm |
| anode | 91 | Au | 10–300 nm | 50 nm |
| HTL | 92 | TAD | 5–500 nm | 50 nm |
| ETL and EL | 93 | Alq3 | 20–1000 nm | 70 nm |
| thin metal | 94.1 | Ca | 0.01–10 nm | 1 nm |
| cathode ohmic contact layer | 94.2 | GaN | 10–2000 nm | 50 nm |
| | 94.3 | InGaN | 10–2000 nm | 50 nm |
| outer cathode | 94.4 | ITO | 10–2000 nm | 50 nm |

Figure 13:
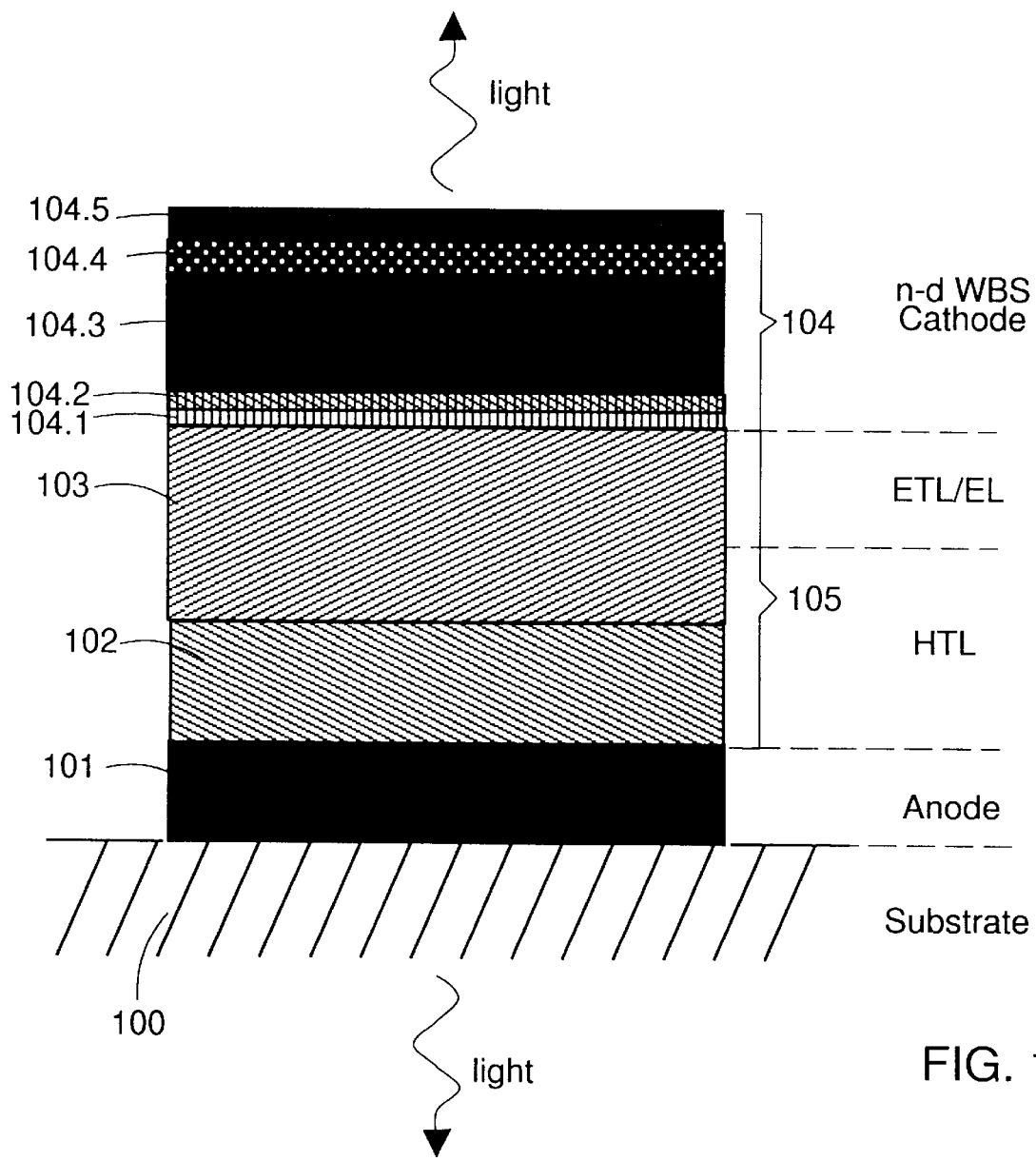
FIG. 13 shows a cross-section of the fifth embodiment of the present invention.
Figure 14:
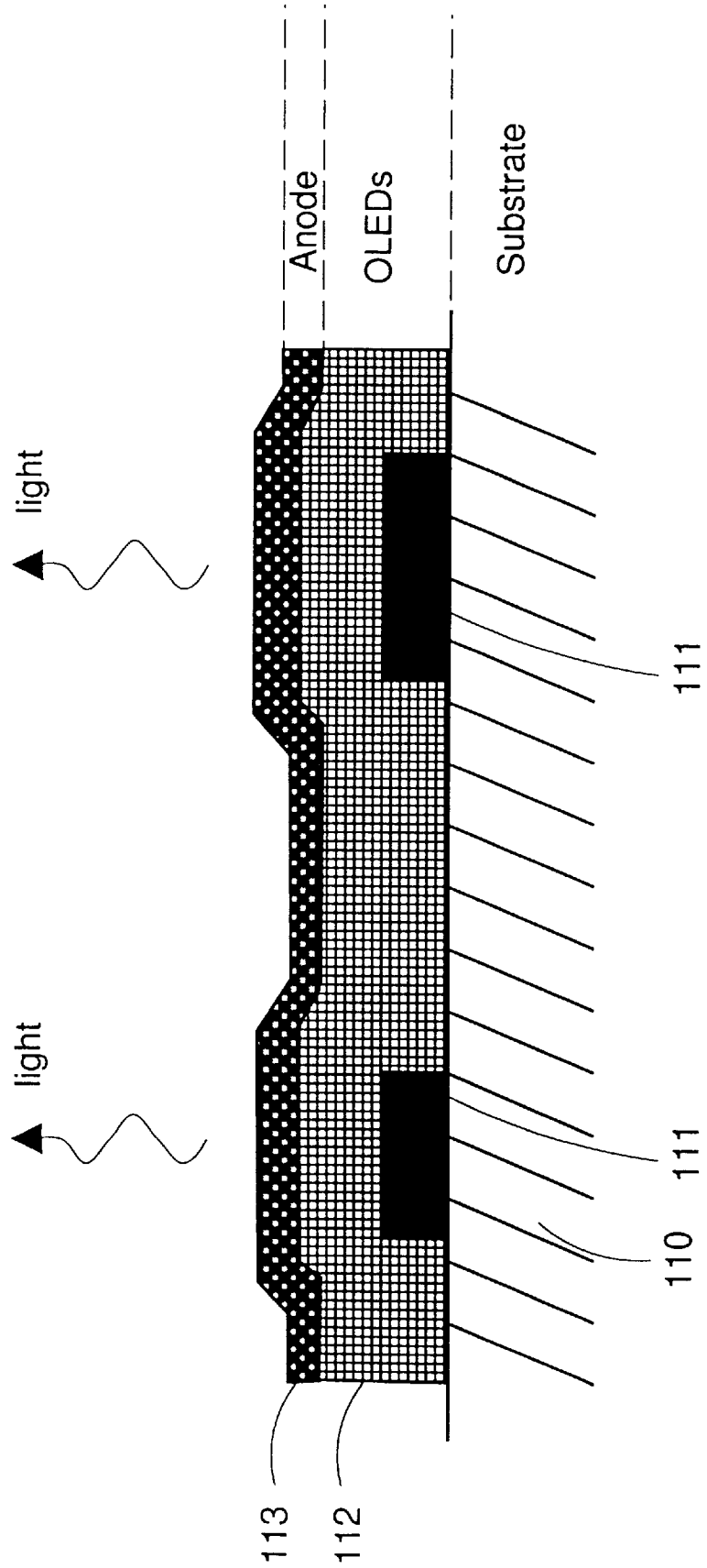
FIG. 14 shows a cross-section of a display or array, according to the present invention.

FIG. 13 depicts an OLED structure in which a n-d WBS cathode 104 comprises and encapsulates an embedded thin low work function metal 104.2 (TM) interlayer near the cathode/organic interface. The TM can function as a chemical, mechanical, protective or diffusion barrier, or improve electron Injection by creating a dipole or providing electrons to the CB of the n-d WBS 104.1 adjacent to the ETL 103. It can also be highly transparent since only small quantities are necessary. The organic region 105 of the fourth embodiment comprises a combined ETL/EL layer 103 and a HTL 102.

TABLE 5

Exemplary details of the fifth embodiment

| Layer | No. | Material | Thickness | present example |
|---|---|---|---|---|
| substrate | 100 | glass | 0.1 mm–5 mm | 1 mm |
| anode | 101 | ITO | 10–300 nm | 50 nm |
| HTL | 102 | TAD | 5–500 nm | 50 nm |
| ETL and EL | 103 | Alq3 | 20–1000 nm | 70 nm |
| cathode Interlayer | 104.1 | ZnS | 1–20 nm | 5 nm |
| TM | 104.2 | LI | 1–20 nm | 2 nm |
| cathode | 104.3 | GaN | 10–200 nm | 50 nm |
| ohmic contact | 104.4 | InGaN | 10–200 nm | 20 nm |
| outer cathode | 104.5 | ITO | 10–2000 nm | 20 nm |

We note that the thin encapsulated metal concept is equally valid for anodes, provided that the metal Is a high work function metal if Its primary role is to enhance hole injection. This concept is also equally valid for n-d WBS based contacts grown either before or after the deposition of the organic stack. Finally, there is no reason that the n-d WBS on either side of the TM must be the same material. In fact, certain advantages are obtained if they are different materials. For example, it may be desirable to have a n-d WBS Interlayer 104.1 which can be gently evaporated onto the organic surface, or is otherwise harmless to the organic, in direct contact to the organic, even if the n-d WBS Interlayer 104.1 does not have otherwise favorable properties, for example a barrier to injection or poor conduction. These two problems can be solved because electrons from the adjacent TM, provided the outer n-d WBS 104.3 has a higher CB energy, will be transferred to the n-d WBS 104.1 in direct:contact to the organic which will raise its Fermi level above the CB and lower the barrier to electron injection and also provide conduction electrons. Another example is if the n-d WBS Interlayer 104.1 in direct contact with the organic which has a higher CB energy than the TM Fermi level. In this case, if the n-d WBS 104.1 is made thin enough, electrons from the TM can tunnel through the intervening n-d WBS 104.1 and still achieve low voltage injection. This approach might permit the use of a highly insulating n-d WBS, without regard for the difficulties of injecting electrons into it or providing conduction electrons.

In the following, some display embodiments, based on and enabled by the present invention, are disclosed.

It would be advantageous if one could integrate OLEDs onto Si substrates because prior to OLED deposition, the substrate could be fabricated to contain active Si devices, such as for example an active matrix, drivers, memory and so forth. Such a structure can be a very Inexpensive small area organic display with high resolution and performance realized primarily in the Si. An OLED, OLED arrays or an OLED display may either be grown directly on such a Si substrate carrying Si devices, or it may be fabricated separately and flipped onto the Si substrate later. A problem is the Si metallization. Traditional OLED cathode metals are not stable in Si processes or air. Another problem is that a transparent top contact is needed because Si is not transparent. The present invention offers a solution to these problems. The disclosed n-d WBS based electrodes permit a stable, low voltage contact of either polarity to be formed on top of the standard Si process metallizations, and are therefore compatible with OLED technology. In addition, n-d WBS based electrodes might not require patterning, which would save manufacturing by permitting the finished Si IC substrate to be inserted directly into the OLED deposition process. The low conductivity of n-d WBS's in comparison to conventional metal contact materials means that if the n-d WBS based contact is deposited in blanket fashion over the entire Si IC, conduction occur primarily in the vertical direction in which the dimensions are small (on the order of 50 nm), while negligible conduction in the lateral direction (on the order of 1 $\mu$m) would occur. Controlling lateral current conduction is critical to avoid crosstalk between pixels. Both n-d WBS based cathodes and anodes can be deposited to form transparent top electrodes to allow light extraction above the substrate plane. Finally, n-d WBS based anodes, in particular, deposited before the deposition of the OLED device are also advantageous for displays compared to the conventional ITO or Au metallization approach, for reasons of stability and reliability, as well as lower voltage injection.

Figure 15:
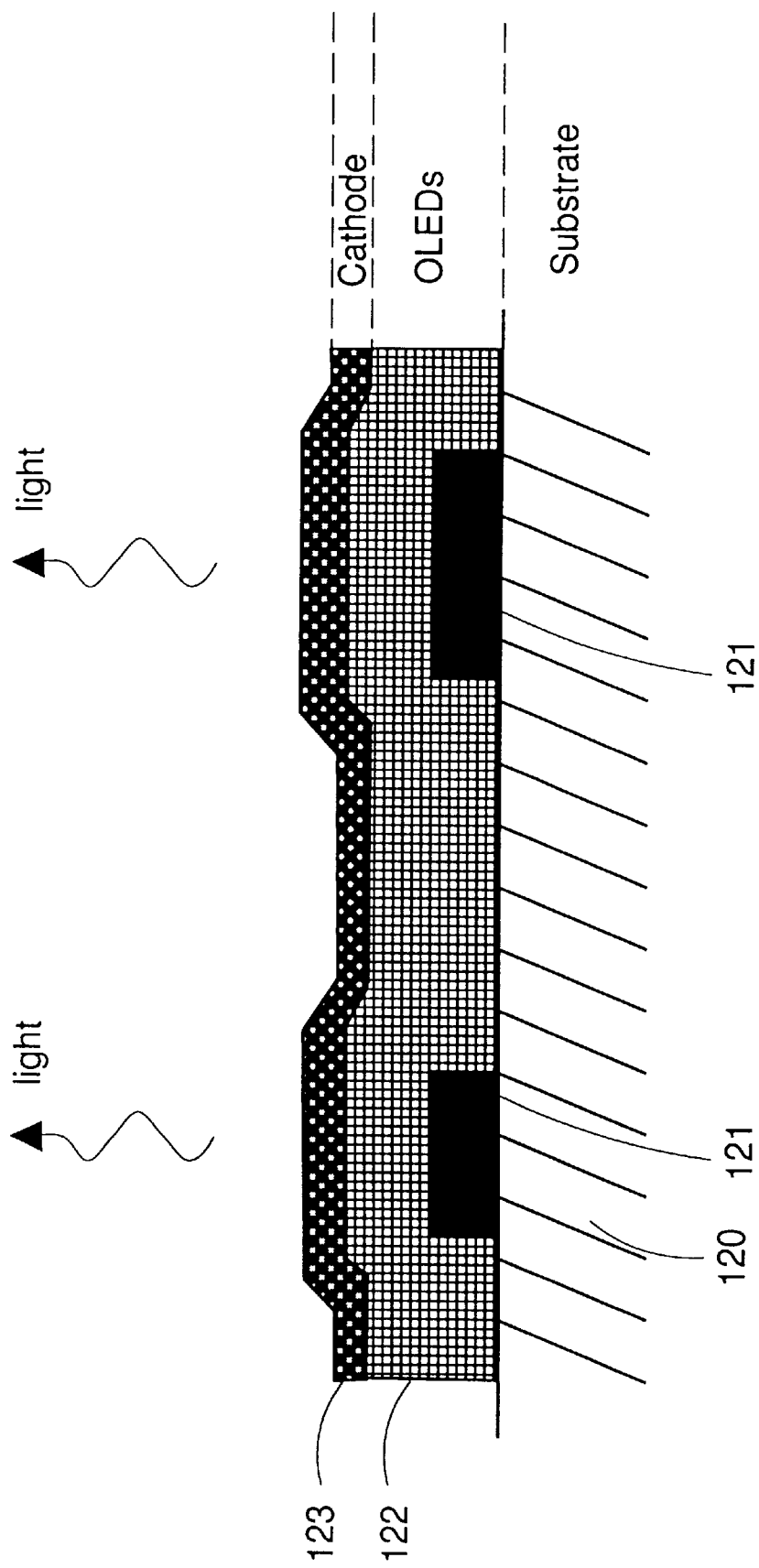
FIG. 15 shows a cross-section of a display or array, according to the present invention.

An organic array or display structure formed on a Si substrate is illustrated in FIG. 15 and described in the following. This display comprises a Si substrate 120 which has integrated circuits comprising active and/or passive devices such as memory cells, drivers, capacitors, transistors etc. (these devices are not shown). On top of the Si integrated circuit, a stable OLED anode (e.g. a n-d WBS based anode according to the present invention, or otherwise a conventional ITO, Au, Ni, Pt or Cr anode) 121 is patterned to connect the Si devices to the OLEDs 122. An OLED 122, in the cathode-up geometry is deposited on the patterned anodes 121 and Si substrate 120. Finally, a n-d WBS based cathode 123 is provided. It is to be noted that no details of the OLED(s) are shown for sake of simplicity, but the OLED may be any color, even white. In the case of white or blue OLED devices, full color display function could be realized by patterning color filter and/or conversion layers respectively, above the transparent cathode 123, of by flipping a patterned array of color filters or converters onto the transparent cathode 123. An advantage of n-d WBS based contacts is that the top cathode 123 would make the organic device 122 resistant to the required patterning steps because of its properties as an encapsulant. Finally, we note that the use of a Si IC substrate enables the top cathode 123 to be common to all devices, which avoids expensive and difficult patterning or wiring of the individual pixel top electrodes.

For example, an Al-metallized Si chip 120 on which Au, ITO or InGaN/GaN anodes 121 are patterned may serve as substrate for an OLED array or display 122. One such OLED comprises (from the bottom to the top): a stable anode layer, a HTL, an organic doped or undoped active region, an ETL, and a cathode 123 which comprises GaN. This cathode 123 may for example be composed of the following stack of 'layers': MgSe/TM/GaN/InGaN/ITO.

Figure 16:
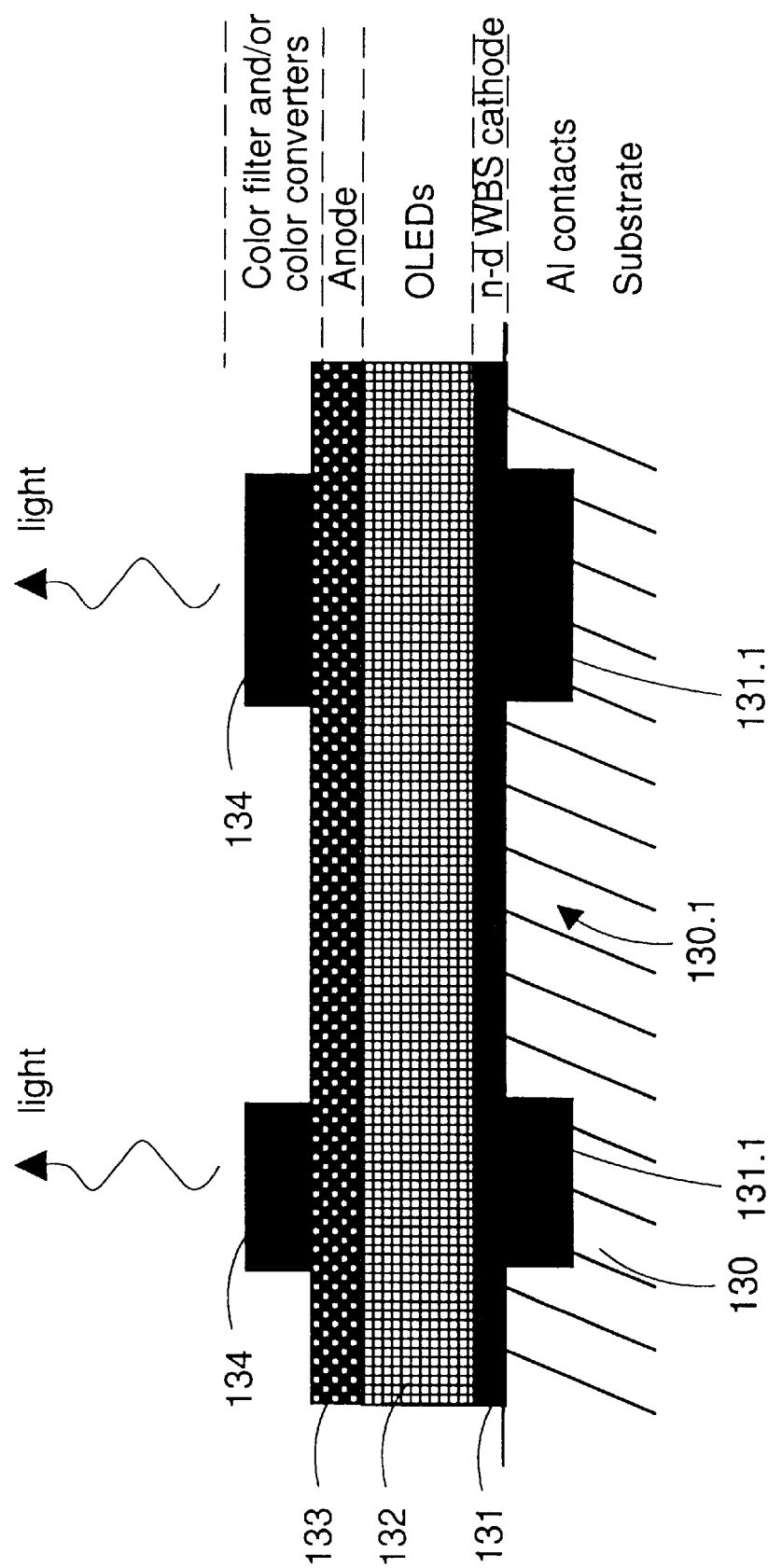
FIG. 16 shows a cross-section of a display or array, according to the present invention.

Another array or display embodiment, where the OLEDs 132 have the anode up, is illustrated in FIG. 16. In this Figure, OLEDs 132 on top of a Si substrate 130 are schematically shown. In this case, the Si substrate 130 is partially covered by Al metal electrodes 131.1 which Inject charge into the n-d WBS cathodes 131. Other areas 130.1 do not conduct current. In addition, the Si IC substrate 130 could be planarized during the back end of the Si processing. This approach lowers processing cost because a blanket n-d WBS based cathode 131 can be deposited immediately before OLED deposition, and does not require additional patterning. As discussed above, this is possible because the intended vertical current must traverse a distance much smaller than the spacings between Al contact pads 131.1. Simple geometry insures that little crosstalk will occur, even when the anode 133 is common to all devices, as is shown in FIG. 16. The top anode 133 must be transparent since the Si substrate 130 is opaque to most visible light. The top anode 133 could also be improved if a n-d WBS based contact is used. The anode 133 could for example be composed of the following stack of layers: AlGaN/GaN/InGaN/ITO. Color could also be conveniently incorporated Into the embodiment shown in FIG. 16 by means of color filters and/or converters 134 which are deposited or patterned onto the transparent top contact.

The anode up embodiment on Si of FIG. 16 may have advantages compared to the cathode up version of FIG. 15 which arise from the generally higher hole mobilities in preferred HTL layers compared to electron mobilities in preferred ETL layers. If any damage to the upper organic layer occurs during electrode deposition, or contamination diffuses through the electrode and degrades the HTL, it could still have a higher mobility than the buried and ungraded ETL, and therefore not be the limiting factor in overall current conduction. Simply put, since the HTL initially outperforms the ETL in known OLED devices, the device is less sensitive to the Initial stages of degradation of the HTL than the ETL.

Figure 17:
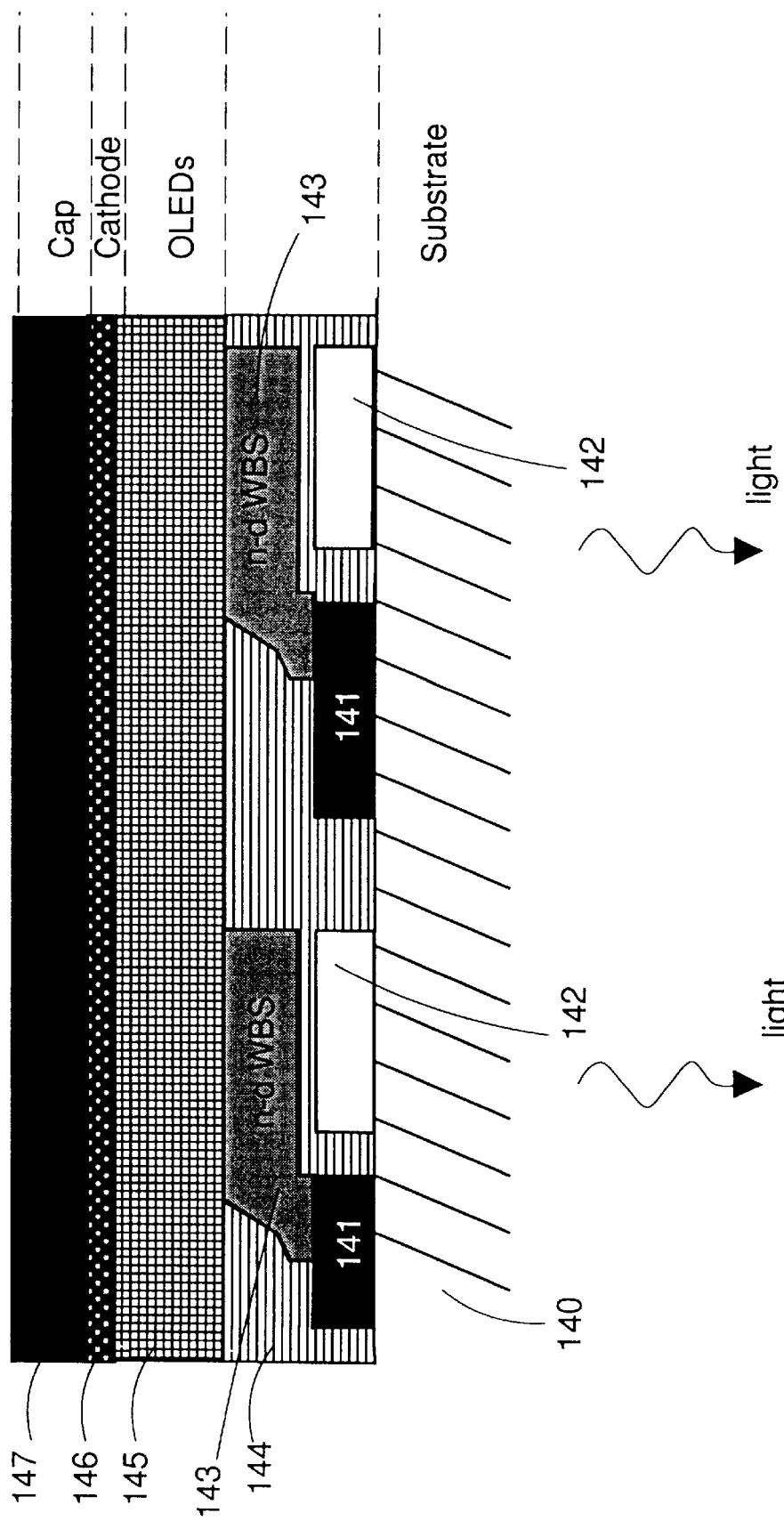
FIG. 17 shows a cross-section of a display or array, according to the present invention.

Another possible display embodiment, illustrated in FIG. 17, is described below. This display comprises a transparent substrate 140 on top of which amorphous-Si or poly-Si structures are formed using the same technology developed for active matrix liquid crystal displays. Usually the Si is structured to provide thin-film-transistors 141 (TFTs) and other devices, to produce an active matrix. Single crystal Si devices 141 thin enough to be highly transparent could also be transferred onto a glass substrate to perform largely the same function with improved performance compared to poly-silicon or amorphous Si circuits. These Si circuits 141 may then be covered or planarized by special layers 144. Color filters or color converters 142 can be provided, In addition, if the OLEDs 145 emit white or blue light, respectively. The Si devices 141 include structured n-d WBS based transparent cathodes or anodes 143, for example, onto which the OLEDs 145 can be deposited. The top electrode might also be a n-d WBS based contact, or a conventional contact. An advantage of this approach is that entrenched active matrix liquid crystal display (AMLCD) technology can be leveraged In combination with OLEDs to realize inexpensive, high performance AM displays over large areas. Furthermore, clever design permits light to be emitted through the glass substrate 140 so no transparent top contact (anode 146) is needed. The anode 146 may be covered by a cap layer 147. The anode in this embodiment could also be n-d WBS based, and could even be made transparent if a surface emitting device were desirable.

The organic region of the present devices may—in addition to charge transport layers if needed at all—either comprise:
- a stack. of more than one organic emission layers (EL), or
- an organic compound doped with one or more impurities, organic or inorganic, chosen to dominate and enhance the electroluminescence, or
- a stack of more than one organic emission layer, some of which may be doped to dominate or enhance the electroluminescence of that particular organic emission layers, or
- a stack of more than one organic layer, in which the role of one or more of said organic layers is to electrically confine one or more carrier types to improve the emission of an adjacent organic layer.

In the following some examples of the different organic materials which can be used are given.

Electron Transport/Emitting Materials:

Alq3, Gaq3, Inq3, Scq3, BAlq3 (q means 8-hydroxyquinoline) and other 8-hydroxyquinoline metal complexes such as Znq2, Beq2, Mgq2, ZnMq2, BeMq2, and AlPrq3, for example. These materials can be used as ETL or emission layer. Other classes of electron transporting materials are deficient nitrogen containing systems, for example oxadiazoles like PBD (any many derivatives), triazoles, for example TAZ (1,2,4-triazole). These functional groups can also be incorporated in polymers, starburst and spiro compounds. Further classes are materials containing pyridine, pyriimidine, pyrazine and pyridazine functionalities. Finally, materials containing quinoline, quinoxaline, cinnoline, phthalazine and quinaziline functionalities are well known for their electron transport capabilities. Other materials are cyano-substituted polymers, didecyl sexithiophene (DPS6 T), bis-triisopropylsilyl sexithiophene (2D6 T), Azomethin-zinc complexes, pyrazine (e.g. BNVP), strylanthracent derivatives (e.g. BSA-1, BSA-2), non-planar distyrylarylene derivatives,:for example DPVBi (see C. Hosokawa and T. Kusumoto, International Symposium on Inorganic and Organic Electroluminescence 1994, Hamamatsu, 42), cyano PPV (PPV means poly(p-phenylenevinylene)) and cyano PPV derivatives.

The following materials are particularly well suited as Emission Layers and Dopants:

Anthracene, phyridine derivatives (e.g. ATP), Azomethin-zinc complexes, pyrazine (e.g. BNVP), strylanthracent derivatives (e.g. BSA-1, BSA-2), Coronene (also suited as dopant), Coumarin (also suited as dopant), DCM compounds (DCM1, DCM2; both also suited as dopants), distyryl arylene derivatives (DSA), alkyl-substituted distyrylbenzene derivatives (DSB), benzimidazole derivatives (e.g. NBI), naphthostyrylamine derivatives (e.g. NSD), oxadiazole derivatives (e.g. OXD, OXD-1, OXD-7), N,N,N',N'-tetrakis(m-methylphenul)-1,3-diaminobenzene (PDA), Perylene and Perylene derivatives, phenyl-substituted cyclopentadiene derivatives, 12-phthaloperinone derivatives (PP), squarilium dye (Sq), 1,1,4,4-tetraphenyl-1,3-butadiene (TPBD), sexithiophene (6 T), poly(2,4-bis (cholestanoxyl)-1,4-phenylene-vinylene (BCHA-PPV), Polythiophenes, quinacridones (QA) (see T. Wakimoto et al., International Symposium on Inorganic and Organic Electroluminescence, 1994, Hamamatsu, 77), and substituted quinacridones (MQA), Rubrene, DCJT (see for example: C. Tang, SID Conference San Diego; Proceedings, 1996, 181), conjugated and non-conjugated polymers, for example PPV and PPV derivatives (soluble precursor), MEH-PPV (poly(2-methoxyl,5-(2'ethyl-hexoxy)-1,4-phenylene-vinylene), dialkoxy and dialkyl PPV derivatives, segmented PPVs (see for example: E. Staring in International Symposium on Inorganic and Organic Electroluminescence, 1994, Hamamatsu, 48, and T. Oshino et al. in Sumitomo Chemicals, 1995 monthly report).

Hole Transport Layers and Hole Injection Layers:

The following materials as suited as hole injection layers and hole transport layers. Materials containing aromatic amino groups, like TDP, NPB (see C. Tang, SID Meeting San Diego, 1996, and C. Adachi et al. Applied Physics Letters, Vol. 66, p. 2679, 1995), TPA, NIPC, TPM, DEH (for the abbreviations see for example: P. Borsenberger and D. S. Weiss, Organic Photoreceptors for Imaging Systems, Marcel Dekker, 1993). These aromatic groups can also be incorporated polymers, starburst (for example: TCTA, m-MTDATA, see Y. Kuwabara et al., Advanced Materials, 6, p. 677, 1994, Y. Shirota et al., Applied Physics Letters, Vol. 65, p. 807, 1994) and spiro compounds. Further examples are: Cu(II) phtalocyanine (CuPc), NPB (N,N'-diphenyl-N,N'-bis-(4-phenylphenyl)-1,1'-biphenyl-4,4'-diamine) distyryl arylene derivatives (DSA), naphthalene, naphthostyrylamine derivatives (e.g. NSD), Quinacridone (QA; also suited as dopant), poly(3-methylthiophene) family (P3 MT), Perylene and Perylene derivatives, polythiophene (PT), 3,4,9,10-perylenetetracarboxylic dianhydride (PTCDA) (also suited as isolator), tetra phenyidiaminodiphenyl (TPD-1, TPD-2, or TAD), PPV and some PPV derivatives, poly(2-methoxyl,5-(2'ethyl-hexoxy)-1,4-phenylene-vinylene (MEH-PPV), poly (9-vinylcarbazole) (PVK), discotic liquid crystal materials (HPT).

There are many other organic materials known as being good light emitters, and many more will be discovered. These materials can be used as well for making light emitting structures according to the present invention. Examples of such materials are given in the publications cited in the introductory portion of the present description. The contents of these publications is herewith incorporated by means of reference.

Additionally, blend (i.e. guest host) systems containing active groups in a polymeric binder are also possible. The concepts employed in the design of organic materials for OLED applications are to a large extent derived from the extensive existing experience in organic photoreceptors. A brief overview of some organic materials used in the fabrication of organic photoreceptors is found in the above mentioned publication of P. Brosenberger and D. S. Weiss, and in Teltech, Technology Dossier Service, Organic Electroluminescence (1995), as well as in the primary literatur.

OLEDs have been demonstrated using polymeric, oligomeric and small organic molecules. The devices formed from each type of molecules are similar in function, although the deposition of the layers varies widely. The present Invention is equally valid in all forms described above for polymeric and oligomeric organic light emitting devices.

Small Molecule devices are routinely made by vacuum evaporation. This is extremely compatible with PEMBD of GaN. Evaporation can be performed in a Bell jar type chamber with independently controlled resistive and electron-beam heating of sources. It can also be performed in a Molecular Beam Deposition System incorporating multiple effusion cells and electron-beam evaporators. In each case, GaN deposition can occur in the same chamber, a vacuum connected chamber, or even a separate chamber if some atmospheric contamination is tolerable.

Oligomeric and Polymeric organics can also be deposited by evaporation of their monomeric components with later polymerization via heating or plasma excitation at the substrate. It is therefore possible to alloy these by co-evaporation also, and they are fully compatible with monomeric compounds.

In general, polymer containing devices (single layer, multilayer, polymer blend systems, etc.) are made by dissolving the polymer in a solvent and spreading it over the substrate either by spin coating or the doctor blade technique. After coating the substrate, the solvent is removed by heating or otherwise. This method allows the fabrication of well defined multilayer structures, provided that the respective solvents for each subsequent layer do not dissolve previously deposited layers. Additionally, hybrid devices containing both polymeric and evaporated small organic molecules are possible. In this case, the polymer film is generally deposited first, since evaporated small molecule layers cannot withstand much processing. More interesting is the possibility of making a polymer/inorganic transport layer on top of which monomeric layers are evaporated, possibly also incorporating alloys. If the polymer is handled in an inert atmosphere prior to introduction to vacuum, sufficient cleanliness for device fabrication is maintained. In any case, the chemical inertness of GaN and other n-d WBS makes it highly tolerant of polymer OLED processing.

To summarize, all inventions here are fully compatible to polymeric, oligomeric, and small molecule OLED designs, or any hybrid design thereof."

What is claimed is:

1. An organic light emitting device comprising:
    a substrate;
    two contact electrodes, one thereof serving as an anode and the other one serving as a cathode; and
    an organic region in which electroluminescence takes place if a voltage is applied between the contact electrodes,
    wherein at least one of the contact electrodes comprises a non-degenerate wide bandgap semiconductor, such that,
    if that contact electrode serves as a cathode, the non-degenerate wide bandgap semiconductor conduction band is essentially aligned with respect to the LUMO of the organic region for injection of electrons from the conduction band (CB) of the non-degenerate wide bandgap semiconductor into the LUMO of the organic region, or such that,
    if that contact electrode serves as an anode, the non-degenerate wide bandgap semiconductor valence band is essentially aligned with respect to the HOMO of the organic region for injection of holes from the valence band (VB) of the non-degenerate wide bandgap semiconductor into the HOMO of the organic region.

2. The organic light emitting device of claim 1, wherein each of the contact electrodes comprises a non-degenerate wide bandgap semiconductor.

3. The organic light emitting device of claim 1, wherein the sequence of layers is: substrate/cathode/organic region/anode.

4. The organic light emitting device of claim 3, wherein light generated by said electroluminescence is either emitted from said organic region through said anode, or from said organic region through said cathode and substrate.

5. The organic light emitting device of claim 1, wherein the sequence of layers is: substrate/anode/organic region/cathode.

6. The organic light emitting device of claim 5, wherein light generated by said electroluminescence is either emitted from said organic region through said cathode, or from said organic region through said anode and substrate.

7. The organic light emitting device of claim 1, wherein said organic region comprises a single organic layer or a stack of organic layers.

8. The organic light emitting device of claim 1, wherein said non-degenerate wide bandgap semiconductor is alloyed introducing a semiconductor.

9. The organic light emitting device of claim 8 wherein the semiconductor differs by an isoelectronic element.

10. The organic light emitting device of claim 1, wherein said contact electrode comprising a non-degenerate wide bandgap semiconductor further comprises an interlayer.

11. The organic light emitting device of claim 10, wherein said interlayer is either in direct contact with said organic region, or embedded within said non-degenerate wide bandgap semiconductor.

12. The organic light emitting device of claim 10 wherein the interlayer is a metal interlayer.

13. The organic light emitting device of claim 1, wherein said organic region comprises an electron transport layer being in direct contact with said cathode and/or a hole transport layer being in direct contact with said anode.

14. The organic light emitting device of claim 1, wherein said substrate is transparent or semitransparent.

15. The organic light emitting device of claim 1, wherein said substrate comprises glass or plastic.

16. The organic light emitting device of claim 1, wherein said substrate is flexible.

17. The organic light emitting device of claim 1, wherein said substrate comprises silicon and includes at least one integrated circuit.

18. The organic light emitting device of claim 1, wherein at least one of said contact electrodes comprises an Indium-Tin-Oxide (ITO) layer.

19. The organic light emitting device of claim 1, wherein said organic region further comprises one of:
    a stack of more than one organic emission layer;
    an organic compound doped with one or more impurities, organic or inorganic, chosen to dominate and enhance the electroluminescence;

a stack of more than one organic emission layer, some of which may be doped to dominate or enhance the electroluminescence of that particular organic emission layer ;and a stack of more than one organic layer, in which the role of one or more of said organic layers is to electrically confine one or more carrier types to improve the emission of an adjacent organic layer.

20. An organic light emitting device of claim 1, wherein said non-degenerate semiconductor is a III-N compound.

21. An organic light emitting device of claim 1, wherein said non-degenerate semiconductor is a II-VI compound.

22. An organic light emitting device of claim 1, wherein said non-degenerate semiconductor is one of diamond, SiC, ZnGaSSe, $CaF_2$, and AlP.

23. The light emitting device of claim 1, wherein said non-degenerate wide bandgap semiconductor comprises at least one of the following:

a wide bandgap III-N compound comprising GaN, AlN, BN, AlGaN, InGaN, or InAlGaN;

a wide bandgap II-VI compound comprising ZnS, MgS, ZnSe, MgSe, ZnMgSSe, CdS, ZnO or BeO; and diamond, SiC, ZnGaSSe, CaF2, or AlP.

24. The organic light emitting device of claim 1, wherein a threshold voltage value causing a light emission of said device is ten volts or less.

25. The organic light emitting device of claim 1, wherein said alignment is achieved by a gradation of values of conduction bands if said cathode comprises said non-degenerate wide bandgap semiconductor and said alignment is achieved by a gradation of values of valence bands if said anode comprises said non-degenerate wide bandgap semiconductor.

26. An organic light emitting array or display comprising more than one organic light emitting device pursuant to claim 1.

27. The organic light emitting array or display of claim 26, wherein said more than one organic light emitting device shares the same substrate and said substrate additionally contains at least one of:

at least one other device, at least one circuit, and at least one electrical connector.

28. The organic light emitting array or display of claim 27, wherein said at least one other device said at least one circuit, or said at least one electrical connector drive or control at least one of said more than one organic light emitting device.

29. The organic light emitting array or display of claim 27, wherein said light emitting devices are deposited cathode first or anode first onto said substrate.

30. The organic light emitting array or display of claim 26, further comprising at least one of:

at least one color filter and at least one color converter, thereby providing for the emission of light at different wavelengths.

31. An organic light emitting device comprising:

a substrate;

two contact electrodes, one thereof serving as an anode and the other one serving as a cathode; and an organic region in which electroluminescence takes place if a voltage is applied between the contact electrodes, wherein at least one of the contact electrodes comprises a non-degenerate wide bandgap semiconductor having a bandgap of at least 2.5 eV, such that, if that contact electrode serves as a cathode, the non-degenerate wide bandgap semiconductor conduction band is aligned with respect to the LUMO of the organic region for injection of electrons from the conduction band (CB) of the non-degenerate wide bandgap semiconductor into the LUMO of the organic region, thereby essentially eliminating an electron-injection energy barrier, or such that, if that contact electrode serves as an anode, the non-degenerate wide bandgap semiconductor valence band is aligned with respect to the HOMO of the organic region for injection of holes from the valence band (VB) of the non-degenerate wide bandgap semiconductor into the HOMO of the organic region, thereby essentially eliminating a hole-injection energy barrier.

32. A method of reducing a threshold voltage for electroluminescence in an organic light emitting device having an anode, a cathode, and an organic region in which electroluminescence takes place if a voltage is applied between said anode and said cathode, wherein at least one of said anode and said cathode comprises a non-degenerate wide bandgap semiconductor, said organic region having a highest occupied molecular orbital (HOMO) and a lowest unoccupied molecular orbital (LUMO), said non-degenerate wide bandgap semiconductor having a valence band (VB) and a conduction band (CB), said threshold value being a minimum value of said applied voltage to cause said electroluminescence, said method comprising at least one of the following:

aligning said LUMO of said organic region approximately to said CB of said non-degenerate wide bandgap semiconductor; and aligning said HOMO of said organic region approximately to said VB of said non-degenerate wide bandgap semiconductor.

33. The method of claim 32, wherein a threshold voltage value causing a light emission of said device is ten volts or less.

34. The method of claim 32, wherein said threshold voltage is six volts or less.

* * * * *